(12) United States Patent
Park

(10) Patent No.: US 11,658,149 B2
(45) Date of Patent: May 23, 2023

(54) SEMICONDUCTOR PACKAGE INCLUDING STACKED SEMICONDUCTOR CHIPS

(71) Applicant: SK hynix Inc., Icheon-si (KR)

(72) Inventor: Jin Kyoung Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/200,249

(22) Filed: Mar. 12, 2021

(65) Prior Publication Data

US 2022/0189914 A1 Jun. 16, 2022

(30) Foreign Application Priority Data

Dec. 16, 2020 (KR) .................. 10-2020-0176359

(51) Int. Cl.
*H01L 25/065* (2023.01)
*H01L 23/00* (2006.01)

(52) U.S. Cl.
CPC .......... *H01L 25/0652* (2013.01); *H01L 24/05* (2013.01); *H01L 24/32* (2013.01); *H01L 24/48* (2013.01); *H01L 24/49* (2013.01); *H01L 24/73* (2013.01); *H01L 2224/04042* (2013.01); *H01L 2224/32145* (2013.01); *H01L 2224/48147* (2013.01); *H01L 2224/48157* (2013.01); *H01L 2224/49112* (2013.01); *H01L 2224/49174* (2013.01); *H01L 2224/73215* (2013.01); *H01L 2224/73265* (2013.01); *H01L 2225/0651* (2013.01); *H01L 2225/06506* (2013.01); *H01L 2225/06562* (2013.01)

(58) Field of Classification Search
CPC ..... H01L 25/0657; H01L 24/32; H01L 24/48; H01L 24/49; H01L 24/73; H01L 2224/04042; H01L 2224/32145; H01L 2224/48147; H01L 2224/48157; H01L 2224/49112; H01L 2224/49174; H01L 2225/06562; H01L 2224/73215; H01L 2224/73265; H01L 2225/06506; H01L 2225/0651; H01L 25/0652; H01L 24/05
See application file for complete search history.

(56) References Cited

U.S. PATENT DOCUMENTS

2014/0252640 A1* 9/2014 Kwak ................ H01L 25/0652 257/773
2022/0165678 A1* 5/2022 Kim ..................... H01L 23/295

FOREIGN PATENT DOCUMENTS

KR 101773218 B1 8/2017

* cited by examiner

*Primary Examiner* — Jasmine J Clark
(74) *Attorney, Agent, or Firm* — William Park & Associates Ltd.

(57) ABSTRACT

A semiconductor package including: a base layer; and a first chip stack and a second chip stack sequentially stacked over the base layer, each of the first and second chip stacks including first to fourth semiconductor chips which are offset stacked to expose chip pads at one side edge thereof, and the chip pads including stack identification pads for identifying the first chip stack and the second chip stack, and first and second chip identification pads for identifying the first to fourth semiconductor chips in each of the first and second chip stacks.

20 Claims, 15 Drawing Sheets

FIG. 1C

|     | CP1 | CP2 | CP3 |
|-----|-----|-----|-----|
| 118 | 1   | 1   | 1   |
| 117 | 0   | 1   | 1   |
| 116 | 1   | 0   | 1   |
| 115 | 0   | 0   | 1   |
| 114 | 1   | 1   | 0   |
| 113 | 0   | 1   | 0   |
| 112 | 1   | 0   | 0   |
| 111 | 0   | 0   | 0   |

FIG. 2C

|  | CP0 | CP1 | CP2 |
|---|---|---|---|
| 224 | 0 | 0 | 0 |
| 223 | 0 | 0 | 1 |
| 222 | 0 | 1 | 0 |
| 221 | 0 | 1 | 1 |
| 214 | 1 | 0 | 0 |
| 213 | 1 | 0 | 1 |
| 212 | 1 | 1 | 0 |
| 211 | 1 | 1 | 1 |

|     | CP0 | CP1 | CP2 |
|-----|-----|-----|-----|
| 224 | 0 | 0 | 0 |
| 223 | 0 | 1 | 0 |
| 222 | 0 | 0 | 1 |
| 221 | 0 | 1 | 1 |
| 214 | 1 | 0 | 0 |
| 213 | 1 | 1 | 0 |
| 212 | 1 | 0 | 1 |
| 211 | 1 | 1 | 1 |

Rows 221–224 grouped as 220; rows 211–214 grouped as 210.

FIG. 3C

|     | CP0 | CP1 | CP2 | CP3 |
|-----|-----|-----|-----|-----|
| 328 | 0 | 0 | 0 | 0 |
| 327 | 0 | 1 | 0 | 0 |
| 326 | 0 | 0 | 1 | 0 |
| 325 | 0 | 0 | 0 | 1 |
| 324 | 0 | 0 | 1 | 1 |
| 323 | 0 | 1 | 0 | 1 |
| 322 | 0 | 1 | 1 | 0 |
| 321 | 0 | 1 | 1 | 1 |
| 318 | 1 | 0 | 0 | 0 |
| 317 | 1 | 1 | 0 | 0 |
| 316 | 1 | 0 | 1 | 0 |
| 315 | 1 | 0 | 0 | 1 |
| 314 | 1 | 0 | 1 | 1 |
| 313 | 1 | 1 | 0 | 1 |
| 312 | 1 | 1 | 1 | 0 |
| 311 | 1 | 1 | 1 | 1 |

FIG. 3D

|   | CP0 | CP1 | CP2 | CP3 |
|---|---|---|---|---|
| 328 | 0 | 0 | 0 | 0 |
| 327 | 0 | 1 | 0 | 0 |
| 326 | 0 | 0 | 1 | 0 |
| 325 | 0 | 0 | 0 | 1 |
| 324 | 0 | 1 | 1 | 0 |
| 323 | 0 | 1 | 0 | 1 |
| 322 | 0 | 0 | 1 | 1 |
| 321 | 0 | 1 | 1 | 1 |
| 318 | 1 | 0 | 0 | 0 |
| 317 | 1 | 1 | 0 | 0 |
| 316 | 1 | 0 | 1 | 0 |
| 315 | 1 | 0 | 0 | 1 |
| 314 | 1 | 1 | 1 | 0 |
| 313 | 1 | 1 | 0 | 1 |
| 312 | 1 | 0 | 1 | 1 |
| 311 | 1 | 1 | 1 | 1 |

FIG. 3E

|     | CP0 | CP1 | CP2 | CP3 |
|-----|-----|-----|-----|-----|
| 328 | 0 | 0 | 0 | 0 |
| 327 | 0 | 0 | 0 | 1 |
| 326 | 0 | 0 | 1 | 0 |
| 325 | 0 | 1 | 0 | 0 |
| 324 | 0 | 1 | 1 | 0 |
| 323 | 0 | 1 | 0 | 1 |
| 322 | 0 | 0 | 1 | 1 |
| 321 | 0 | 1 | 1 | 1 |
| 318 | 1 | 0 | 0 | 0 |
| 317 | 1 | 0 | 0 | 1 |
| 316 | 1 | 0 | 1 | 0 |
| 315 | 1 | 1 | 0 | 0 |
| 314 | 1 | 1 | 1 | 0 |
| 313 | 1 | 1 | 0 | 1 |
| 312 | 1 | 0 | 1 | 1 |
| 311 | 1 | 1 | 1 | 1 |

FIG. 3F

|     | CP0 | CP1 | CP2 | CP3 |
|-----|-----|-----|-----|-----|
| 328 | 0 | 0 | 0 | 0 |
| 327 | 0 | 0 | 0 | 1 |
| 326 | 0 | 0 | 1 | 0 |
| 325 | 0 | 1 | 0 | 0 |
| 324 | 0 | 0 | 1 | 1 |
| 323 | 0 | 1 | 0 | 1 |
| 322 | 0 | 1 | 1 | 0 |
| 321 | 0 | 1 | 1 | 1 |
| 318 | 1 | 0 | 0 | 0 |
| 317 | 1 | 0 | 0 | 1 |
| 316 | 1 | 0 | 1 | 0 |
| 315 | 1 | 1 | 0 | 0 |
| 314 | 1 | 0 | 1 | 1 |
| 313 | 1 | 1 | 0 | 1 |
| 312 | 1 | 1 | 1 | 0 |
| 311 | 1 | 1 | 1 | 1 |

500
SEMICONDUCTOR PACKAGE INCLUDING STACKED SEMICONDUCTOR CHIPS

CROSS-REFERENCE TO RELATED APPLICATION

This application claims priority under 35 U.S.C. § 119 to Korean Patent Application No. 10-2020-0176359 filed on Dec. 16, 2020, which is incorporated herein by reference in its entirety.

BACKGROUND

1. Technical Field

This patent document relates to a semiconductor package, and more particularly, to a semiconductor package including a plurality of semiconductor chips which are stacked in a vertical direction.

2. Related Art

Electronic products require high-volume data processing while the sizes of these products are getting smaller. Accordingly, there is a growing need to increase the degree of integration of semiconductor devices used in such electronic products.

However, due to the limitation of semiconductor integration technology, it is difficult to satisfy a required function with only a single semiconductor chip, and thus a semiconductor package in which a plurality of semiconductor chips are embedded has been manufactured.

The plurality of semiconductor chips may be stacked in a vertical direction, and may be electrically connected to each other by an interconnector such as a wire.

SUMMARY

In an embodiment, a semiconductor package may include: a base layer; and a first chip stack and a second chip stack sequentially stacked over the base layer, each of the first and second chip stacks including first to fourth semiconductor chips which are offset stacked to expose chip pads at one side edge of each of the first to fourth semiconductor chips, and the chip pads including stack identification pads for identifying the first chip stack and the second chip stack, and first and second chip identification pads for identifying the first to fourth semiconductor chips in each of the first and second chip stacks, wherein power is applied to the stack identification pads of the first to fourth semiconductor chips of one of the first and second chip stacks, in the first chip stack, the power is applied to the first and second chip identification pads of the first semiconductor chip, one of the first and second chip identification pads of the second semiconductor chip, and the other of the first and second chip identification pads of the third semiconductor chip, and in the second chip stack, the power is applied to the first and second chip identification pads of the first semiconductor chip, one of the first and second chip identification pads of the second semiconductor chip, and the other of the first and second chip identification pads of the third semiconductor chip.

In another embodiment, a semiconductor package may include: a base layer; and a first chip stack and a second chip stack sequentially stacked over the base layer, each of the first and second chip stacks including first to eighth semiconductor chips which are offset stacked to expose chip pads at one side edge of each of the first to eighth semiconductor chips, and the chip pads including stack identification pads for identifying the first chip stack and the second chip stack, and first to third chip identification pads for identifying the first to eighth semiconductor chips in each of the first and second chip stacks, wherein power is applied to the stack identification pads of the first to eighth semiconductor chips of one of the first and second chip stacks, in the first chip stack, the power is applied to the first to third chip identification pads of the first semiconductor chip, two selected from the first to third chip identification pads of each of the second to fourth semiconductor chips, and one selected from the first to third chip identification pads of each of the fifth to seventh semiconductor chips, where the selected two of the second semiconductor chip, the selected two of the third semiconductor chip, and the selected two of the fourth semiconductor chip are different from each other, and the selected one of the fifth semiconductor chip, the selected one of the sixth semiconductor chip, and the selected one of the seventh semiconductor chip are different from each other, and in the second chip stack, the power is applied to the first to third chip identification pads of the first semiconductor chip, two selected from the first to third chip identification pads of each of the second to fourth semiconductor chips, and one selected from the first to third chip identification pads of each of the fifth to seventh semiconductor chips, where the selected two of the second semiconductor chip, the selected two of the third semiconductor chip, and the selected two of the fourth semiconductor chip are different from each other, and the selected one of the fifth semiconductor chip, the selected one of the sixth semiconductor chip, and the selected one of the seventh semiconductor chip are different from each other.

BRIEF DESCRIPTION OF THE DRAWINGS

FIG. 1C is a view illustrating power supply states of chip identification pads of a plurality of semiconductor chips included in the semiconductor package of FIGS. 1A and 1B as logical values.

FIG. 2C is a view illustrating power supply states of stack identification pads and chip identification pads of a plurality of semiconductor chips included in the semiconductor package of FIGS. 2A and 2B as logical values.

FIG. 2D is a view illustrating power supply states of stack identification pads and chip identification pads of a plurality of semiconductor chips included in a semiconductor package according to another embodiment of the present disclosure as logical values.

FIG. 3C is a view illustrating power supply states of stack identification pads and chip identification pads of a plurality of semiconductor chips included in the semiconductor package of FIGS. 3A and 3B as logical values.

FIGS. 3D, 3E, and 3F are views illustrating power supply states of stack identification pads and chip identification pads of a plurality of semiconductor chips included in a semiconductor package according to another embodiment of the present disclosure as logical values.

DETAILED DESCRIPTION

Figure 1A:
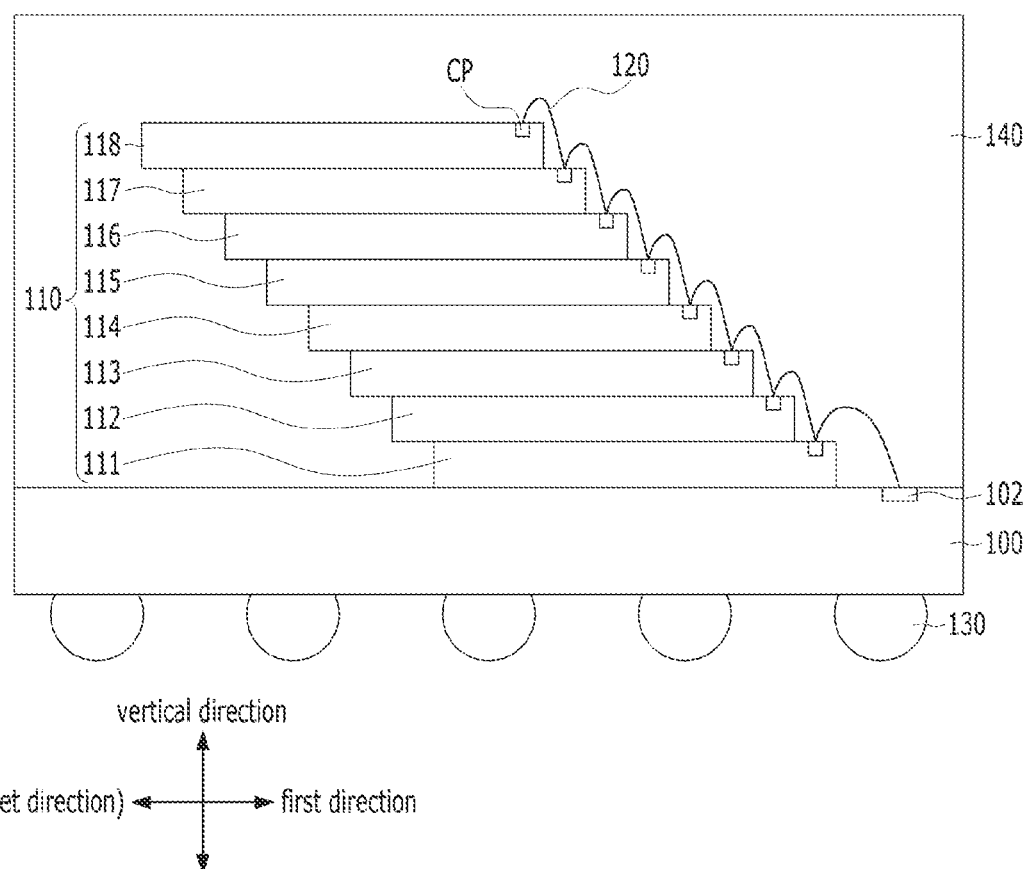
FIG. 1A is a cross-sectional view illustrating a semiconductor package of a comparative example.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being on or "over" a second layer or "on" or "over" a substrate, the first layer may be directly formed on the second layer or the substrate but may also represent a structure where one or more other intermediate layers may exist between the first layer and the second layer or the substrate. It will be understood that when an element, wire, pad, or layer is referred to as being "on," "connected to" or "coupled to" another element, wire, pad, or layer, it can be directly on, connected or coupled to the other element, wire, pad, or layer or intervening elements, wires, pads, or layers may be present. In contrast, when an element, wire, pad, or layer is referred to as being "directly on," "directly connected to" or "directly coupled to" another element, wire, pad, or layer, there are no intervening elements, wires, pads, or layers present.

Prior to the description of the present embodiment, a semiconductor package of a comparative example and its problem will be described.

Figure 1B:
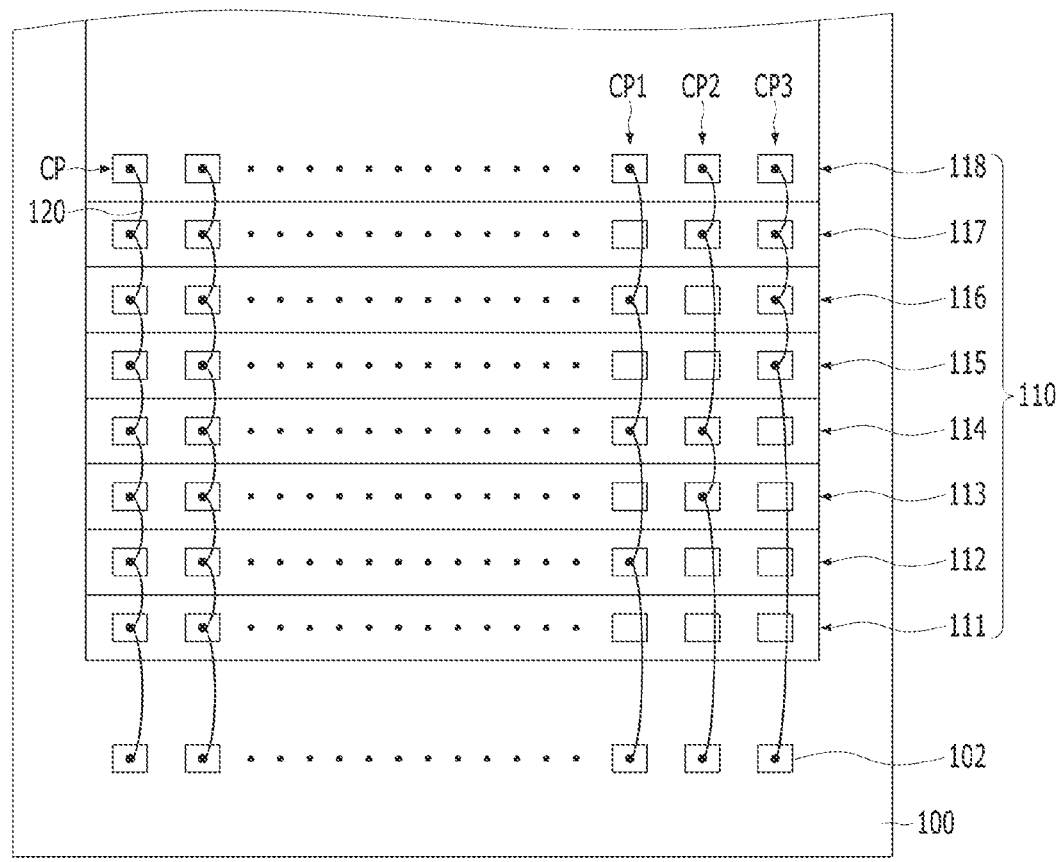
FIG. 1B is a plan view of a part of the semiconductor package of FIG. 1A viewed from above.
Figure 1B:
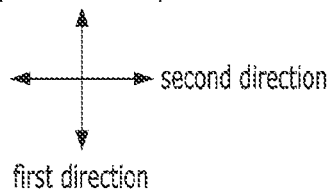
Figure 1D:
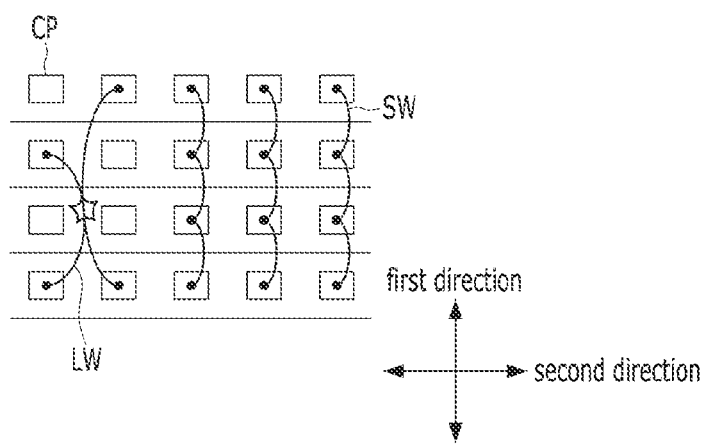
FIG. 1D is a view for explaining a problem that may occur in the semiconductor package of FIGS. 1A and 1B.

FIG. 1A is a cross-sectional view illustrating a semiconductor package of a comparative example, and FIG. 1B is a plan view of a part of the semiconductor package of FIG. 1A viewed from above. FIG. 1C is a view illustrating power supply states of chip identification pads of a plurality of semiconductor chips included in the semiconductor package of FIGS. 1A and 1B as logical values. FIG. 1D is a view for explaining a problem that may occur in the semiconductor package of FIGS. 1A and 1B.

First, referring to FIGS. 1A and 1B, a semiconductor package of a comparative example may include a base layer 100, a chip stack 110, an external connection terminal 130, and a molding layer 140.

The base layer 100 may be a layer having a circuit and/or wiring structure (not shown) for electrically connecting the chip stack 110 to an external component of the semiconductor package. For example, the base layer 100 may include a substrate such as a printed circuit board (PCB), an interposer, a redistribution layer, or the like. Alternatively, when the chip stack 110 includes a memory chip, the base layer 100 may be a semiconductor chip including a logic circuit that supports an operation of the memory chip, for example, reading data from the memory chip or writing data to the memory chip.

The base layer 100 may have one surface on which the chip stack 110 is disposed, for example, an upper surface, and the other surface on which the external connection terminal 130 is disposed, for example, a lower surface. A pad 102 for electrical connection with the chip stack 110 may be disposed on the upper surface of the base layer 100. The pad 102 may be a part of the circuit and/or wiring structure of the base layer 100. Further, although not shown, various pads for electrical connection between the base layer 100 and other components, such as the external connection terminal 130, may be further disposed on the upper surface and/or the lower surface of the base layer 100.

The chip stack 110 may include a plurality of semiconductor chips 111 to 118 which are stacked over the one surface of the base layer 100 in a vertical direction. In the comparative example, the chip stack 110 includes eight semiconductor chips 111 to 118, but the number of semiconductor chips included in the chip stack 110 may be variously modified. In particular, the number of semiconductor chips included in the chip stack 110 may be $2^N$. N may be a natural number of 2 or more. For convenience of description, the plurality of semiconductor chips 111 to 118 will be referred to as a first semiconductor chip 111, a second semiconductor chip 112, a third semiconductor chip 113, a fourth semiconductor chip 114, a fifth semiconductor chip 115, a sixth semiconductor chip 116, a seventh semiconductor chip 117, and an eighth semiconductor chip 118, depending on the distance from the base layer 100. The first to eighth semiconductor chips 111 to 118 may be the same memory chip, for example, a DRAM chip or a NAND flash memory chip. However, the present disclosure is not limited thereto, and the first to eighth semiconductor chips 111 to 118 may be semiconductor chips having various types and functions.

The first to eighth semiconductor chips 111 to 118 may be attached to the upper surface of the base layer 100 and the upper surfaces of the first to seventh semiconductor chips 111 to 117, respectively, by an adhesive layer (not shown) formed on the lower surface thereof.

A plurality of chip pads CP may be disposed on the upper surface of each of the first to eighth semiconductor chips 111 to 118. The plurality of chip pads CP may be disposed at one side edge region of each of the first to eighth semiconductor chips 111 to 118 in a first direction. The first to eighth semiconductor chips 111 to 118 may be stacked in a form in which the upper surfaces on which the chip pads CP are disposed face upward and the lower surfaces face the base layer 100, that is, a face-up form. In this case, the first to eighth semiconductor chips 111 to 118 may be offset stacked in a direction from one side adjacent to the chip pads CP to the other side located opposite to the one side in the first direction so that all the chip pads CP of each of the first to eighth semiconductor chips 111 to 118 are exposed. One side surfaces of the first to eighth semiconductor chips 111 to 118 in a second direction crossing the first direction may be substantially aligned with each other, and the other side surfaces of the first to eighth semiconductor chips 111 to 118 in the second direction may be substantially aligned with each other.

In each of the first to eighth semiconductor chips 111 to 118, the plurality of chip pads CP may be arranged in a line along the second direction. The chip pads CP of the first to eighth semiconductor chips 111 to 118 corresponding to each other, for example, the chip pads CP substantially aligned with each other along the first direction, may perform the same function. As an example, in the plan view of FIG. 1B, the chip pads CP positioned at the leftmost of the first to eighth semiconductor chips 111 to 118 may be connected to each other by a wire 120, and may be connected to the pad 102 of the base layer 100 by the wire 120. Accordingly, the chip pads CP positioned at the leftmost of the first to eighth semiconductor chips 111 to 118 may function as a terminal that receives power from the base layer 100 or exchanges signals with the base layer 100. Particularly, some of the plurality of chip pads CP may function as chip identification pads CP1, CP2, and CP3 for respectively identifying the first to eighth semiconductor chips 111 to 118 included in the chip stack 110. The arrangement of the chip identification pads CP1, CP2, and CP3, power application, and connection with the wire 120 accordingly, will be described later.

The external connection terminal 130 may be formed over the lower surface of the base layer 100, and may function to connect with the external component of the semiconductor package. The external connection terminal 130 may include various interconnectors such as solder balls.

The molding layer 140 may cover the chip stack 110 over the upper surface of the base layer 100. The molding layer 140 may include various molding materials such as EMC (Epoxy Molding Compound).

In the above semiconductor package, because the chip stack 110 includes $2^3$ semiconductor chips 111 to 118, each of the first to eighth semiconductor chips 111 to 118 may include three chip identification pads CP1, CP2, and CP3, that is, a first chip identification pad CP1, a second chip identification pad CP2, and a third chip identification pad CP3. This is because $2^3$ states may be expressed by using three chip identification pads CP1, CP2, and CP3. If the chip stack 110 includes $2^N$ semiconductor chips, each of the semiconductor chips may include N chip identification pads. By using N chip identification pads, $2^N$ states may be expressed.

In the first to eighth semiconductor chips 111 to 118, the first chip identification pads CP1 may be substantially aligned with each other along the first direction, the second chip identification pads CP2 may be substantially aligned with each other along the first direction, and the third chip identification pads CP3 may be substantially aligned with each other along the first direction. In addition, in each of the first to eighth semiconductor chips 111 to 118, the first to third chip identification pads CP1, CP2, and CP3 may be arranged adjacent to each other in the second direction. The first to eighth semiconductor chips 111 to 118 may be distinguished from each other according to combinations of power applied to the first to third chip identification pads CP1, CP2, and CP3. This will be described below with further reference to FIG. 1C together with FIG. 1B.

Referring to FIGS. 1B and 1C, each of the first to third chip identification pads CP1, CP2, and CP3 in the first to eighth semiconductor chips 111 to 118 may be in a state in which the power is applied or in a floating state. Here, the applied power may include various levels of voltages. For example, the applied power may be a power supply voltage (VDD). The state in which the power is applied to any one of the first to third chip identification pads CP1, CP2, and CP3 may be represented by a logical value '1', and the floating state may be represented by a logical value '0'. Each of the first to eighth semiconductor chips 111 to 118 may be expressed by a combination of the logical values of the first to third chip identification pads CP1, CP2, and CP3 thereof. In this case, the power supply states of the first to third chip identification pads CP1, CP2, and CP3 in each of the first to eighth semiconductor chips 111 to 118 may be determined so that the combinations of the logical values expressing the first to eighth semiconductor chips 111 to 118 are different from each other. For example, when the first semiconductor chip 111 is expressed by a logical value combination of '000', all the first to third chip identification pads CP1, CP2, and CP3 of the first semiconductor chip 111 may be in the floating state. Also, when the second semiconductor chip 112 is expressed by a logical value combination of '100', the power may be applied to the first chip identification pad CP1 of the second semiconductor chip 112, and the second and third chip identification pads CP2 and CP3 may be in the floating state. In a similar manner, the first to third chip identification pads CP1, CP2, and CP3 of each of the third to eighth semiconductor chips 113 to 118 may receive the power or be in the floating state so that the third to eighth semiconductor chips 113 to 118 are all expressed by different logical value combinations.

Among the first to third chip identification pads CP1, CP2, and CP3 of the first to eighth semiconductor chips 111 to 118, those to which the power is applied, that is, those expressed by the logical value '1' in FIG. 1C, may be connected to the wire 120. This is to receive the power from the base layer 100 by being connected to the pad 102 of the base layer 100 through the wire 120. On the other hand, among the first to third chip identification pads CP1, CP2, and CP3 of the first to eighth semiconductor chips 111 to 118, those in the floating state, that is, those expressed by the logical value '0' in FIG. 1C, might not be connected to the wire 120. More specifically, among the first chip identification pads CP1 aligned in the first direction, the first chip identification pads CP1 of the second, fourth, sixth, and eighth semiconductor chips 112, 114, 116, and 118 to which the power is applied, may be connected to each other by the wire 120 while being connected to the pad 102 of the base layer 100. In addition, among the second chip identification pads CP2 aligned in the first direction, the second chip identification pads CP2 of the third, fourth, seventh, and eighth semiconductor chips 113, 114, 117, and 118 to which the power is applied, may be connected to each other by the wire 120 while being connected to the pad 102 of the base layer 100. In addition, among the third chip identification pads CP3 aligned in the first direction, the third chip identification pads CP3 of the fifth to eighth semiconductor chips 115 to 118 to which the power is applied, may be connected to each other by the wire 120 while being connected to the pad 102 of the base layer 100.

However, as in this case, the wire 120 may have sections that may be considered a long wire. For reference, the long wire may refer to a wire that skips one or more chip pads CP among the chip pads CP aligned in the first direction, and a short wire may refer to a wire that connects adjacent chip pads CP among the chip pads CP aligned in the first direction, that is, a wire that does not skip the chip pads CR. For example, the portion of wire 120 connecting the first chip identification pad CP1 of the second semiconductor chip 112 and the first chip identification pad CP1 of the fourth semiconductor chip 114 to each other may be the long wire because it skips the third semiconductor chip 113. In addition, for example, the wire 120 connecting the second chip identification pad CP2 of the fourth semiconductor chip 114 and the second chip identification pad CP2 of the seventh semiconductor chip 117 to each other may be the long wire because it skips the fifth and sixth semiconductor chips 115 and 116. The portion of wires 120 corresponding to the long wires may contact each other in the second direction while performing a molding process, resulting in an electrical short failure. Such failure may be further aggravated when the first to eighth semiconductor chips 111 to 118 are not aligned with each other in the second direction due to a process error in the step of stacking the first to eighth semiconductor chips 111 to 118. As such, an electrical short failure is shown, for example, in FIG. 1D.

Referring to FIG. 1D, a short wire SW that connects the chip pads CP adjacent to each other in the first direction, among the chip pads CP aligned in the first direction, that is, that does not skip a semiconductor chip, might not bend or fall sideways, and thus, the electrical short failure might not occur.

On the other hand, a long wire LW that connects the chip pads CP that are not adjacent to each other in the first direction, among the chip pads CP aligned in the first direction, that is, that skips at least one semiconductor chip, may be more likely to bend or fall sideways. Accordingly, adjacent long wires LW in the second direction may contact each other to cause the electrical short failure.

In the present embodiments described below, by using only a short wire that does not skip a semiconductor chip as a wire connecting the chip identification pads to each other, it may be possible to prevent the electrical short failure occurring in the semiconductor package of the comparative example as described above. Further, by optimizing the arrangement of the chip identification pads and the wire connection to the chip identification pads, the length of the wire may be reduced, and accordingly, signal transmission characteristics may be improved.

Figure 2A:
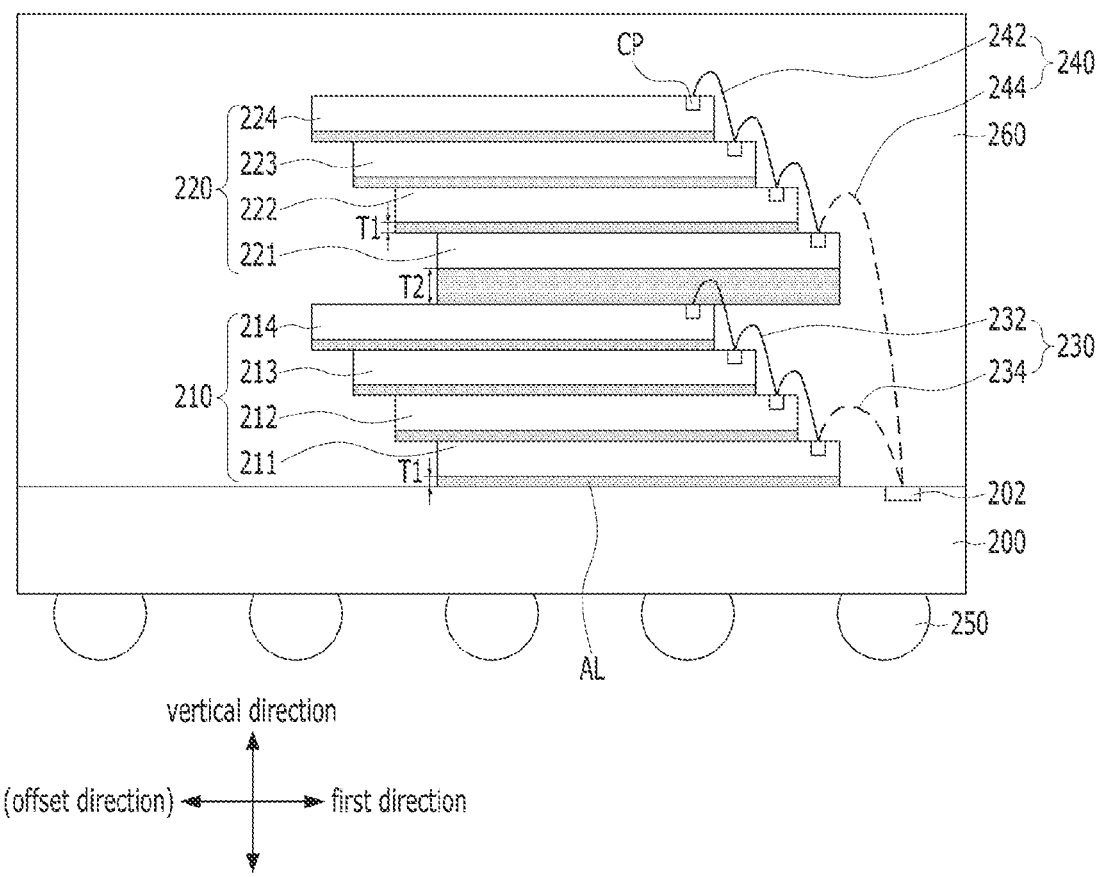
FIG. 2A is a cross-sectional view illustrating a semiconductor package of an embodiment of the present disclosure.
Figure 2B:
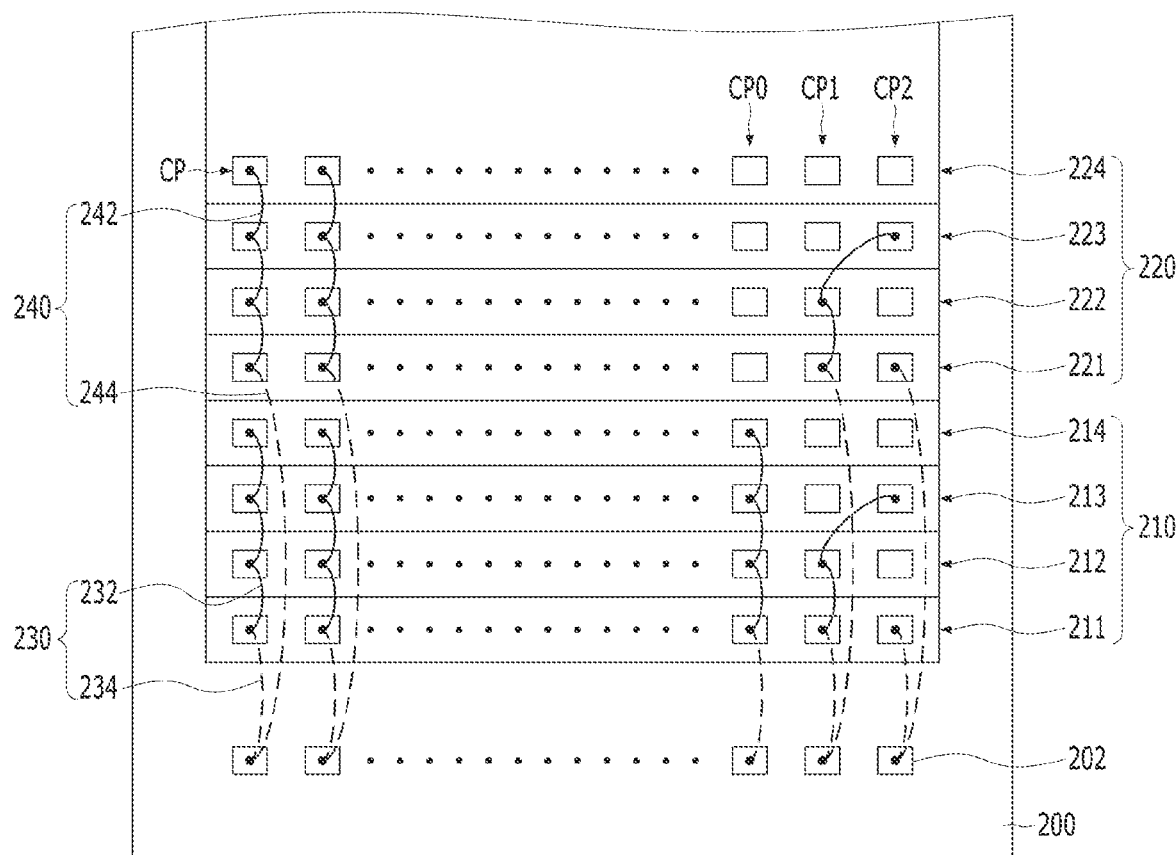
FIG. 2B is a plan view of a part of the semiconductor package of FIG. 2A viewed from above.
Figure 2B:
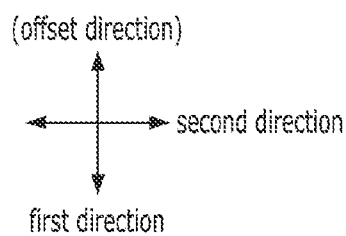

FIG. 2A is a cross-sectional view illustrating a semiconductor package of an embodiment of the present disclosure, and FIG. 2B is a plan view of a part of the semiconductor package of FIG. 2A viewed from above. For reference, when the semiconductor package of FIG. 2A is viewed from above, a part or a whole of a first chip stack may be covered by a second chip stack, but for convenience of description, the plan view of FIG. 28 illustrates the first and second chip stacks so that all the chip pads of the first and second chip stacks are fully visible. FIG. 2C is a view illustrating power supply states of stack Identification pads and chip identification pads of a plurality of semiconductor chips included in the semiconductor package of FIGS. 2A and 2B as logical values.

First, referring to FIGS. 2A and 2B, a semiconductor package of the present embodiment may include a base layer 200, a first chip stack 210 formed over one surface of the base layer 200 and including a plurality of semiconductor chips 211 to 214, a first wire 230 connecting the first chip stack 210 and the base layer 200 while connecting the plurality of semiconductor chips 211 to 214 to each other, a second chip stack 220 formed over the first chip stack 210 and including a plurality of semiconductor chips 221 to 224, a second wire 240 connecting the second chip stack 220 and the base layer 200 while connecting the plurality of semiconductor chips 221 to 224 to each other, an external connection terminal 250 formed over the other surface of the base layer 200, and a molding layer 260 covering the first and second chip stacks 210 and 220.

The base layer 200 may be a layer having a circuit and/or wiring structure (not shown) for electrically connecting the first and second chip stacks 210 and 220 to an external component of the semiconductor package. For example, the base layer 200 may include a substrate such as a printed circuit board, an interposer, a redistribution layer, or the like. Alternatively, when the first and second chip stacks 210 and 220 include a memory chip, the base layer 200 may be a semiconductor chip including a logic circuit that supports an operation of the memory chip, for example, reading data from the memory chip or writing data to the memory chip.

The base layer 200 may have the one surface on which the first and second chip stacks 210 and 220 are disposed, for example, an upper surface, and the other surface on which the external connection terminal 250 is disposed, for example, a lower surface. A pad 202 for electrical connection with the first and second chip stacks 210 and 220 may be disposed on the upper surface of the base layer 200. The pad 202 may be a part of the circuit and/or wiring structure of the base layer 200. Further, although not shown, various pads for electrical connection between the base layer 200 and other components, such as the external connection terminal 250, may be further disposed on the upper surface and/or the lower surface of the base layer 200.

The first chip stack 210 may include the plurality of semiconductor chips 211 to 214 which are stacked over the one surface of the base layer 200 in a vertical direction. In the present embodiment, the first chip stack 210 includes four semiconductor chips 211 to 214, but the number of semiconductor chips included in the first chip stack 210 may be variously modified. In particular, the number of semiconductor chips included in the first chip stack 210 may be $2^{N-1}$. N may be a natural number of 2 or more. For convenience of description, the plurality of semiconductor chips 211 to 214 will be referred to as a first semiconductor chip 211, a second semiconductor chip 212, a third semiconductor chip 213, and a fourth semiconductor chip 214, depending on the distance from the base layer 200. The first to fourth semiconductor chips 211 to 214 may be the same memory chip, for example, a DRAM chip or a NAND flash memory chip. However, the present disclosure is not limited thereto, and the first to fourth semiconductor chips 211 to 214 may be semiconductor chips having various types and functions.

An adhesive layer AL may be formed over a lower surface of each of the first to fourth semiconductor chips 211 to 214. By the adhesive layer AL, the first semiconductor chip 211 may be attached to the upper surface of the base layer 200, and the second to fourth semiconductor chips 212 to 214 may be attached to upper surfaces of the first to third semiconductor chips 211 to 213, respectively. The adhesive layer AL may include an insulating adhesive material such as a die attach film (DAF).

A plurality of chip pads CP may be disposed on the upper surface of each of the first to fourth semiconductor chips 211 to 214. The plurality of chip pads CP may be disposed at one side edge region of each of the first to fourth semiconductor chips 211 to 214 in a first direction. The first to fourth semiconductor chips 211 to 214 may be stacked in a form in which the upper surfaces on which the chip pads CP are disposed face upward and the lower surfaces face the base layer 200, that is, a face-up form. In this case, the first to fourth semiconductor chips 211 to 214 may be offset stacked in a direction from one side adjacent to the chip pads CP to the other side located opposite to the one side in the first direction so that all the chip pads CP of each of the first to fourth semiconductor chips 211 to 214 are exposed. One side surfaces of the first to fourth semiconductor chips 211 to 214 in a second direction crossing the first direction may be substantially aligned with each other, and the other side surfaces of the first to fourth semiconductor chips 211 to 214 in the second direction may be substantially aligned with each other.

In each of the first to fourth semiconductor chips 211 to 214, the plurality of chip pads CP may be arranged in a line along the second direction. The chip pads CP of the first to fourth semiconductor chips 211 to 214 corresponding to each other, for example, the chip pads CP substantially aligned with each other along the first direction, may perform the same function. As an example, in the plan view of FIG. 2B, the chip pads CP positioned at the leftmost of the first to fourth semiconductor chips 211 to 214 may be connected to each other by the first wire 230, and may be connected to the pad 202 of the base layer 200 by the first wire 230. Accordingly, the chip pads CP positioned at the leftmost of the first to fourth semiconductor chips 211 to 214 may function as a terminal that receives power from the base layer 200 or exchanges signals with the base layer 200. Particularly, some of the plurality of chip pads CP may function as stack identification pads CP0 for distinguishing the first chip stack 210 from the second chip stack 220, and chip identification pads CP1 and CP2 for identifying the first to fourth semiconductor chips 211 to 214 included in the first chip stack 210. The arrangement of the stack identification pads CP0 and the chip identification pads CP1 and CP2 in the first chip stack 210, power application, and connection with the first wire 230 accordingly, will be described later.

The first wire 230 may provide the connection between the first to fourth semiconductor chips 211 to 214 included in the first chip stack 210, and between the first chip stack 210 and the base layer 200. For convenience of description, a part of the first wire 230, which connects the chip pads CP between the first to fourth semiconductor chips 211 to 214, will be referred to as a first inter-chip wire 232, and a part of the first wire 230, which connects the chip pad CP of the first semiconductor chip 211 located at the lowermost portion of the first chip stack 210 and the pad 202 of the base layer 200, will be referred to as a first stack wire 234. For convenience, the first inter-chip wire 232 is shown as a solid line and the first stack wire 234 is shown as a dotted line, but this does not reflect the actual shape of the wire.

The second chip stack 220 may include the plurality of semiconductor chips 221 to 224 stacked over the first chip stack 210 in the vertical direction. In the present embodiment, the second chip stack 220 includes four semiconductor chips 221 to 224, but the number of semiconductor chips included in the second chip stack 220 may be variously modified. In particular, the number of semiconductor chips included in the second chip stack 220 may be $2^{N-1}$, which is the same as the number of the semiconductor chips included in the first chip stack 210. Accordingly, the semiconductor package of the present embodiment may include a total of $2^N$ semiconductor chips. For convenience of description, the plurality of semiconductor chips 221 to 224 of the second chip stack 220 will be referred to as a first semiconductor chip 221, a second semiconductor chip 222, a third semiconductor chip 223, and a fourth semiconductor chip 224, depending on the distance from the first chip stack 210. The first to fourth semiconductor chips 221 to 224 may be the same memory chip, for example, a DRAM chip or a NAND flash memory chip. However, the present disclosure is not limited thereto, and the first to fourth semiconductor chips 221 to 224 may be semiconductor chips having various types and functions. Further, the first to fourth semiconductor chips 221 to 224 of the second chip stack 220 may be the same as the first to fourth semiconductor chips 211 to 214 of the first chip stack 210.

The adhesive layer AL may be formed over a lower surface of each of the first to fourth semiconductor chips 221 to 224 of the second chip stack 220. By the adhesive layer AL, the first semiconductor chip 221 may be attached to the upper surface of the fourth semiconductor chip 214 located at the uppermost portion of the first chip stack 210, and the second to fourth semiconductor chips 222 to 224 may be attached to upper surfaces of the first to third semiconductor chips 221 to 223, respectively.

The plurality of chip pads CP may be disposed on the upper surface of each of the first to fourth semiconductor chips 221 to 224. The plurality of chip pads CP may be disposed at one side edge region of each of the first to fourth semiconductor chips 221 to 224 in the first direction. The first to fourth semiconductor chips 221 to 224 may be stacked in a form in which the upper surfaces on which the chip pads CP are disposed face upward and the lower surfaces face the base layer 200, that is, a face-up form. In this case, the first to fourth semiconductor chips 221 to 224 may be offset stacked in a direction from one side adjacent to the chip pads CP to the other side located opposite to the one side in the first direction so that all the chip pads CP of each of the first to fourth semiconductor chips 221 to 224 are exposed. The first to fourth semiconductor chips 221 to 224 of the second chip stack 220 may be stacked in the same offset direction as the first to fourth semiconductor chips 211 to 214 of the first chip stack 210. Accordingly, the second chip stack 220 may have the same/similar step shape as the first chip stack 210. One side surfaces of the first to fourth semiconductor chips 221 to 224 in the second direction may be substantially aligned with each other, and the other side surfaces of the first to fourth semiconductor chips 221 to 224 in the second direction may be substantially aligned with each other. Further, the one side surfaces of the first to fourth semiconductor chips 221 to 224 of the second chip stack 220 may be substantially aligned with the one side surfaces of the first to fourth semiconductor chips 211 to 214 of the first chip stack 210 in the second direction, and the other side surfaces of the first to fourth semiconductor chips 221 to 224 of the second chip stack 220 may be substantially aligned with the other side surfaces of the first to fourth semiconductor chips 211 to 214 of the first chip stack 210 in the second direction.

In each of the first to fourth semiconductor chips 221 to 224, the plurality of chip pads CP may be arranged in a line along the second direction. The chip pads CP of the first to fourth semiconductor chips 221 to 224 corresponding to each other, for example, the chip pads CP substantially aligned with each other along the first direction, may perform the same function. As an example, in the plan view of FIG. 2B, the chip pads CP positioned at the leftmost of the first to fourth semiconductor chips 221 to 224 may be connected to each other by the second wire 240, and may be connected to the pad 202 of the base layer 200 by the second wire 240. Accordingly, the chip pads CP positioned at the leftmost of the first to fourth semiconductor chips 221 to 224 may function as a terminal that receives the power from the base layer 200 or exchanges signals with the base layer 200. Further, the chip pads CP of the first to fourth semiconductor chips 211 to 214 aligned in the first direction, and the chip pads CP of the first to fourth semiconductor chips 221 to 224 corresponding and/or aligned therewith, may perform the same function. Accordingly, the first and second wires 230 and 240 connected to the aligned chip pads CP in the first direction may be commonly connected to the same pad 202 of the base layer 200. Some of the plurality of chip pads CP may function as stack identification pads CP0 for distinguishing the second chip stack 220 from the first chip stack 210, and chip identification pads CP1 and CP2 for identifying the first to fourth semiconductor chips 221 to 224 included in the second chip stack 220. The arrangement of the stack identification pads CP0 and the chip identification pads CP1 and CP2 in the second chip stack 220, power application, and connection with the second wire 240 accordingly, will be described later.

The second wire 240 may provide the connection between the first to fourth semiconductor chips 221 to 224 included in the second chip stack 220 and between the second chip stack 220 and the base layer 200. For convenience of description, a part of the second wire 240, which connects the chip pads CP between the first to fourth semiconductor chips 221 to 224, will be referred to as a second inter-chip wire 242, and a part of the second wire 230, which connects the chip pad CP of the first semiconductor chip 221 located at the lowermost portion of the second chip stack 220 and the pad 202 of the base layer 200, will be referred to as a second stack wire 244. For convenience, the second inter-chip wire 242 is shown as a solid line and the second stack wire 244 is shown as a dotted line, but this does not reflect the actual shape of the wire.

Meanwhile, when the second chip stack 220 is stacked over the first chip stack 210, one side surface of the first semiconductor chip 221 located at the lowermost portion of the second chip stack 220, may protrude from one side surface of the fourth semiconductor chip 214 located at the uppermost portion of the first chip stack 210, toward a direction opposite to the offset direction. This is to reduce the area occupied by the first and second chip stacks 210 and 220 in a plan view, to prevent the second stack wire 244 from contacting the first wire 230, and not to increase the length of the second stack wire 244 as much as possible. For reference, due to the distance between the second chip stack 220 and the base layer 200 in the vertical direction, the second stack wire 244 may have a relatively long length compared to the first inter-chip wire 232, the first stack wire 234, and the second inter-chip wire 242. As a length of a wire increases, the electrical path through the wire may become longer and the signal transmission characteristics may deteriorate. Therefore, it may be desirable to reduce the length of the second stack wire 244.

In this case, the thickness T2 of the adhesive layer AL on the lower surface of the first semiconductor chip 221 located at the lowermost portion of the second chip stack 220 may be greater than the thickness T1 of the adhesive layer AL on the lower surface of each of other semiconductor chips 211 to 214 and 222 to 224 of the first and second chip stacks 210 and 220. This is because the loop of the first inter-chip wire 232 connected to the chip pad CP of the fourth semiconductor chip 214 protrudes above the upper surface of the fourth semiconductor chip 214. The thickness T2 of the adhesive layer AL on the lower surface of the first semiconductor chip 221 may have a sufficiently large value so that the loop is covered by the adhesive layer AL on the lower surface of the first semiconductor chip 221, and the lower surface of the first semiconductor chip 221 is spaced apart from the fourth semiconductor chip 214 of the first chip stack 210.

The external connection terminal 250 may be formed over the lower surface of the base layer 200, and may function to connect to the external component of the semiconductor package. The external connection terminal 250 may include various interconnectors such as solder balls.

The molding layer 260 may cover the first and second chip stacks 210 and 220 over the upper surface of the base layer 200. The molding layer 260 may include various molding materials such as EMC.

In the above semiconductor package, because the first chip stack 210 includes $2^2$ semiconductor chips 211 to 214, each of the first to fourth semiconductor chips 211 to 214 may include at least two chip identification pads to distinguish/identify them within the first chip stack 210. For example, each of the first to fourth semiconductor chips 211 to 214 may include first and second chip identification pads CP1 and CP2. This is because $2^2$ states may be expressed by using two chip identification pads. Further, in order to distinguish/identify the first chip stack 210 and the second chip stack 220, each of the first to fourth semiconductor chips 211 to 214 of the first chip stack 210 may include one stack identification pad CP0. Also, because the second chip stack 220 includes $2^2$ semiconductor chips 221 to 224, each of the first to fourth semiconductor chips 221 to 224 may include at least two chip identification pads, that is, first and second chip identification pads CP1 and CP2, to distinguish/identify them within the second chip stack 220. Further, in order to distinguish/identify the first chip stack 210 and the second chip stack 220, each of the first to fourth semiconductor chips 221 to 224 of the second chip stack 220 may include one stack identification pad CP0.

In the first to fourth semiconductor chips 211 to 214 of the first chip stack 210 and the first to fourth semiconductor chips 221 to 224 of the second chip stack 220, the stack identification pads CP0 may be substantially aligned with each other along the first direction, the first chip identification pads CP1 may be substantially aligned with each other along the first direction, and the second chip identification pads CP2 may be substantially aligned with each other along the first direction. In each of the first to fourth semiconductor chips 211 to 214 of the first chip stack 210 and the first to fourth semiconductor chips 221 to 224 of the second chip stack 220, the stack identification pad CP0, the first chap identification pad CP1, and the second chip identification pad CP2 may be arranged adjacent to each other in the second direction. However, the present disclosure is not limited thereto, and in another embodiment, the first and second chip identification pads CP1 and CP2 may be adjacent to each other, and the stack identification pad CP0 may be spaced apart from the first and second chip identification pads CP1 and CP2, in the second direction. That is, another chip pad CP may be disposed between the stack identification pad CP0 and the first and second chip identification pads CP1 and CP2 while any chip pad CP is not interposed between the first and second chip identification pads CP1 and CP2. The first to fourth semiconductor chips 211 to 214 of the first chip stack 210 and the first to fourth semiconductor chips 221 to 224 of the second chip stack 220 may be distinguished from each other according to combinations of power applied to the stack identification pads CP0, and the first and second chip identification pads CP1 and CP2. This will be described below with further reference to FIG. 2C together with FIG. 2B.

Referring to FIGS. 2B and 2C, each of the stack identification pad CP0, the first chip identification pad CP1, and the second chip identification pad CP2 may be in a state in which the power is applied or in a floating state. Here, the applied power may include various levels of voltages. For example, the applied power may be a power supply voltage (VDD). The state in which the power is applied to any one of the stack identification pad CP0, the first chip identification pad CP1, and the second chip identification pad CP2 may be represented by a logical value '1', and the floating state may be represented by a logical value '0'.

Here, the power supply states of the stack identification pads CP0 of the first chip stack 210 may be different from the power supply states of the stack identification pads CP0 of the second chip stack 220 so that the first chip stack 210 and the second chip stack 220 are distinguished/identified. That is, the logical value of the stack identification pads CP0 of the first chip stack 210 may be different from the logical value of the stack identification pads CP0 of the second chip stack 220. In the present embodiment, the stack identification pads CP0 of the first to fourth semiconductor chips 211 to 214 of the first chip stack 210 may be supplied with the power, that is, may have the logical value '1', and the stack identification pads CP0 of the first to fourth semiconductor chips 221 to 224 of the second chip stack 220 may be in the floating state, that is, may have the logical value '0'. Because the stack identification pads CP0 of the first to fourth semiconductor chips 221 to 224 of the second chip stack 220 do not receive the power, bonding wire connection thereto may be omitted as illustrated. An opposite case of the present embodiment, that s a case in which the stack identification pads CP0 of the first chip stack 210 are in the floating state and the stack identification pads CP0 of the second chip stack 220 are supplied with the power, may be possible. However, the present embodiment may be desirable in terms of reducing the length of the wire and improving signal transmission characteristics accordingly.

The stack identification pads CP0 of the first chip stack 210 may be connected to the base layer 200 through the first wire 230, More specifically, the stack identification pads CP0 of the first to fourth semiconductor chips 211 to 214 of the first chip stack 210 may be connected to each other through the first inter-chip wire 232, and the stack identification pad CP0 of the first semiconductor chip 211 may be connected to the pad 202 of the base layer 200 through the first stack wire 234. Because the stack identification pads CP0 of the second chip stack 220 are in the floating state, they might not be connected to a wire.

In addition, in order to distinguish/identify the first to fourth semiconductor chips 211 to 214 in the first chip stack 210, four logical value combinations expressed by the power supply states of the first and second chip identification pads CP1 and CP2 may be different from each other. In the present embodiment, the first and second chip identification pads CP1 and CP2 of the lowermost first semiconductor chip 211 may be in a state in which the power is applied, that is, a state having the logical value '1'. The second semiconductor chip 212 may be in a state in which one of the first and second chip identification pads CP1 and CP2, for example, the first chip identification pad CP1, receives the power, that is, has the logical value '1', and the other of the first and second chip identification pads CP1 and CP2, for example, the second chip identification pad CP2 is in the floating state, that is, has the logical value '0'. The third semiconductor chip 213 may be in a state in which the other of the first and second chip identification pads CP1 and CP2, for example, the second chip identification pad CP2, receives the power, that is, has the logical value '1', and one of the first and second chip identification pads CP1 and CP2, for example, the first chip identification pad CP1 is in the floating state, that is, has the logical value '0'. The fourth semiconductor chip 214 may be in a state in which the first and second chip identification pads CP1 and CP2 are in the floating state, that is, have the logical value '0'.

The first and second chip identification pads CP1 and CP2 of the first chip stack 210 may be connected to the base layer 200 through the first wire 230. More specifically, the second chip identification pad CP2 of the third semiconductor chip 213, the first chip identification pad CP1 of the second semiconductor chip 212, and the first chip identification pad CP1 of the first semiconductor chip 211 may be connected to each other through the first inter-chip wire 232, and the first and second chip identification pads CP1 and CP2 of the first semiconductor chip 211 may be connected to the pad 202 of the base layer 200 through the first stack wire 234. In particular, because the first and second chip identification pads CP1 and CP2 connected to the first inter-chip wire 232 in the second and third semiconductor chips 212 and 213 are arranged in a diagonal direction crossing the first and second directions, they may be connected to each other through the first inter-chip wire 232 in the diagonal direction. In this case, because the first inter-chip wire 232 does not include a long wire which skips a semiconductor chip, occurrence of electrical short failure due to wire interference in the first chip stack 210 may be reduced. Furthermore, because the first and second chip identification pads CP1 and CP2 of the first semiconductor chip 211 having the closest distance from the base layer 200, are connected to the first wire 230 while the first and second chip identification pads CP1 and CP2 of the fourth semiconductor chip 214 having the farthest distance from the base layer 200 are not connected to the first wire 230, it may be possible to reduce the length of the wire used in the first chip stack 210 and improve signal transmission characteristics accordingly.

Similarly, in order to distinguish/identify the first to fourth semiconductor chips 221 to 224 in the second chip stack 220, four logical value combinations expressed by the power supply states of the first and second chip identification pads CP1 and CP2 may be different from each other. In the present embodiment, the first and second chip identification pads CP1 and CP2 of the lowermost first semiconductor chip 221 may be in a state in which the power is applied, that is, a state having the logical value '1'. The second semiconductor chip 222 may be in a state in which one of the first and second chip identification pads CP1 and CP2, for example, the first chip identification pad CP1, receives the power, that is, has the logical value '1', and the other of the first and second chip identification pads CP1 and CP2, for example, the second chip identification pad CP2 is in the floating state, that is, has the logical value '0'. The third semiconductor chip 223 may be in a state in which the other of the first and second chip identification pads CP1 and CP2, for example, the second chip identification pad CP2, receives the power, that is, has the logical value '1', and one of the first and second chip identification pads CP1 and CP2, for example, the first chip identification pad CP1 is in the floating state, that is, has the logical value '0'. The fourth semiconductor chip 224 may be in a state in which the first and second chip identification pads CP1 and CP2 are in the floating state, that is, have the logical value '0'.

The first and second chip identification pads CP1 and CP2 of the second chip stack 220 may be connected to the base layer 200 through the second wire 240. More specifically, the second chip identification pad CP2 of the third semiconductor chip 223, the first chip identification pad CP1 of the second semiconductor chip 222, and the first chip identification pad CP1 of the first semiconductor chip 221 may be connected to each other through the second inter-chip wire 242, and the first and second chip identification pads CP1 and CP2 of the first semiconductor chip 221 may be connected to the pad 202 of the base layer 200 through the second stack wire 244. In particular, because the first and second chip identification pads CP1 and CP2 connected to the second inter-chip wire 242 in the second and third semiconductor chips 222 and 223 are arranged in a diagonal direction crossing the first and second directions, they may be connected to each other through the second inter-chip wire 242 in the diagonal direction. In this case, because the second inter-chip wire 242 does not include a long wire skipping a semiconductor chip, occurrence of electrical short failure due to wire interference in the second chip stack 220 may be reduced. Furthermore, because the first and second chip identification pads CP1 and CP2 of the first semiconductor chip 221 having the closest distance from the base layer 200 are connected to the second wire 240, and the first and second chip identification pads CP1 and CP2 of the fourth semiconductor chip 224 having the farthest distance from the base layer 200 are not connected to the second wire 240, at may be possible to reduce the length of the wire used in the second chip stack 230 and improve signal transmission characteristics accordingly. Unlike the first inter-chip wire 232, the second inter-chap wire 242, and the first stack wire 234, the second stack wire 244 may be a long wire skipping the first chip stack 210. However, interference between the second stack wire 244 and the first wire 230 and the resulting electrical short failure may be prevented by a structure in which the second chip stack 220 is protruded and stacked over the first chip stack 210.

Meanwhile, the power supply states of the first and second chip identification pads CP1 and CP2 of the first chip stack 210 and the connection form of the first wire 230 accordingly, and the power supply states of the first and second chip identification pads CP1 and CP2 of the second chip stack 220 and the connection form of the second wire 240 accordingly, are not limited to the illustrated ones. When the power is applied to all of the first and second chip identification pads CP1 and CP2 of the first semiconductor chips 211 and 221 respectively positioned at the lowermost portions of the first and second chip stacks 210 and 220, and all of the first and second chip identification pads CP1 and CP2 of the fourth semiconductor chips 214 and 224 respectively positioned at the uppermost portions of the first and second chip stacks 210 and 220 are in the floating state, the power supply states of the first and second chip identification pads CP1 and CP2 of the second and third semiconductor chips 212, 213, 222, and 223, and connection forms of the first and second inter-chip wires 232 and 242 accordingly, may be variously modified. This will be described, for example, with reference to FIG. 2D.

FIG. 2D is a view illustrating power supply states of stack identification pads and chip identification pads of a plurality of semiconductor chips included in a semiconductor package according to another embodiment of the present disclosure as logical values. In this figure, the wires connected to the stack identification pads and the chip identification pads are shown in the form of arrows. The description will focus on differences from the semiconductor package of FIGS. 2A to 2C described above.

Referring to FIG. 2D, apart from the above-described embodiment, the power may be applied to the first chip identification pads CP1 of the third semiconductor chips 213 and 223 and the second chip identification pads CP2 of the second semiconductor chips 212 and 222. Accordingly, the first chip identification pad CP1 of each of the third semiconductor chips 213 and 223, the second chip identification pad CP2 of each of the second semiconductor chips 212 and 222, and the second chip identification pad CP2 of each of the first semiconductor chips 211 and 221, may be connected to each other by an inter-chip wire. Each of the first and second chip identification pads CP1 and CP2 of the first semiconductor chips 211 and 221 may be connected to a base layer through a stack wire.

Although not shown, other embodiments may be possible. For example, the power supply states of the first and second chip identification pads CP1 and CP2 of the first chip stack 210 and the wire connection state may be the same as the embodiment of FIGS. 2B and 2C, and the power supply states of the first and second chip identification pads CP1 and CP2 of the second chip stack 220 and the wire connection state may be the same as the embodiment of FIG. 2D. Alternatively, for example, the power supply states of the first and second chip identification pads CP1 and CP2 of the first chip stack 210 and the wire connection state may be the same as the embodiment of FIG. 2D, and the power supply states of the first and second chip identification pads CP1 and CP2 of the second chip stack 220 and the wire connection state may be the same as the embodiment of FIGS. 2B and 2C.

Meanwhile, in the embodiments of FIGS. 2A to 2D, a case in which each of two chip stacks includes four semiconductor chips has been described, but the present disclosure is not limited thereto. Each of the two chip stacks may include eight semiconductor chips. This will be described in more detail with reference to FIGS. 3A to 3F below.

Figure 3A:
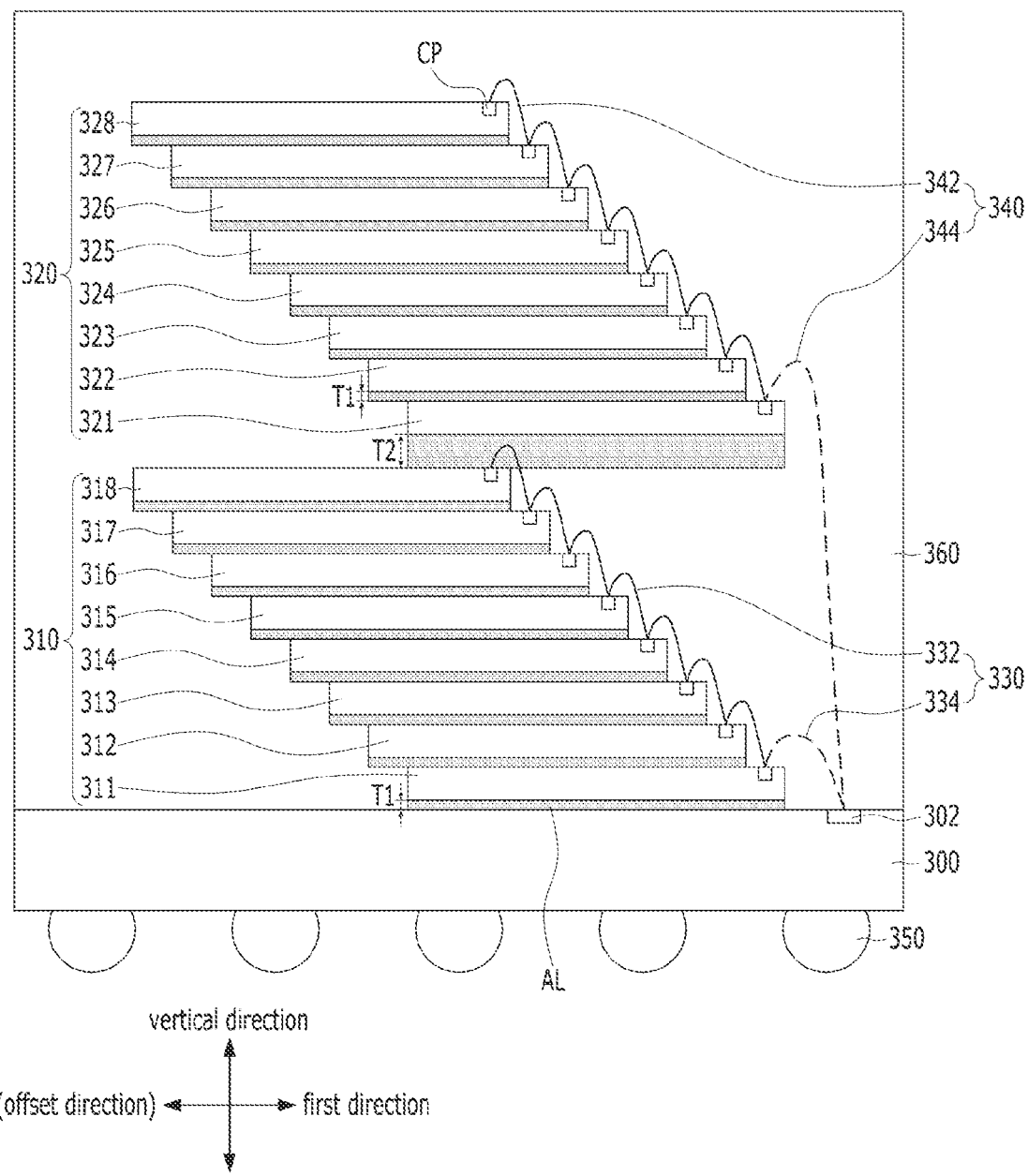
FIG. 3A is a cross-sectional view illustrating a semiconductor package of another embodiment of the present disclosure.
Figure 3B:
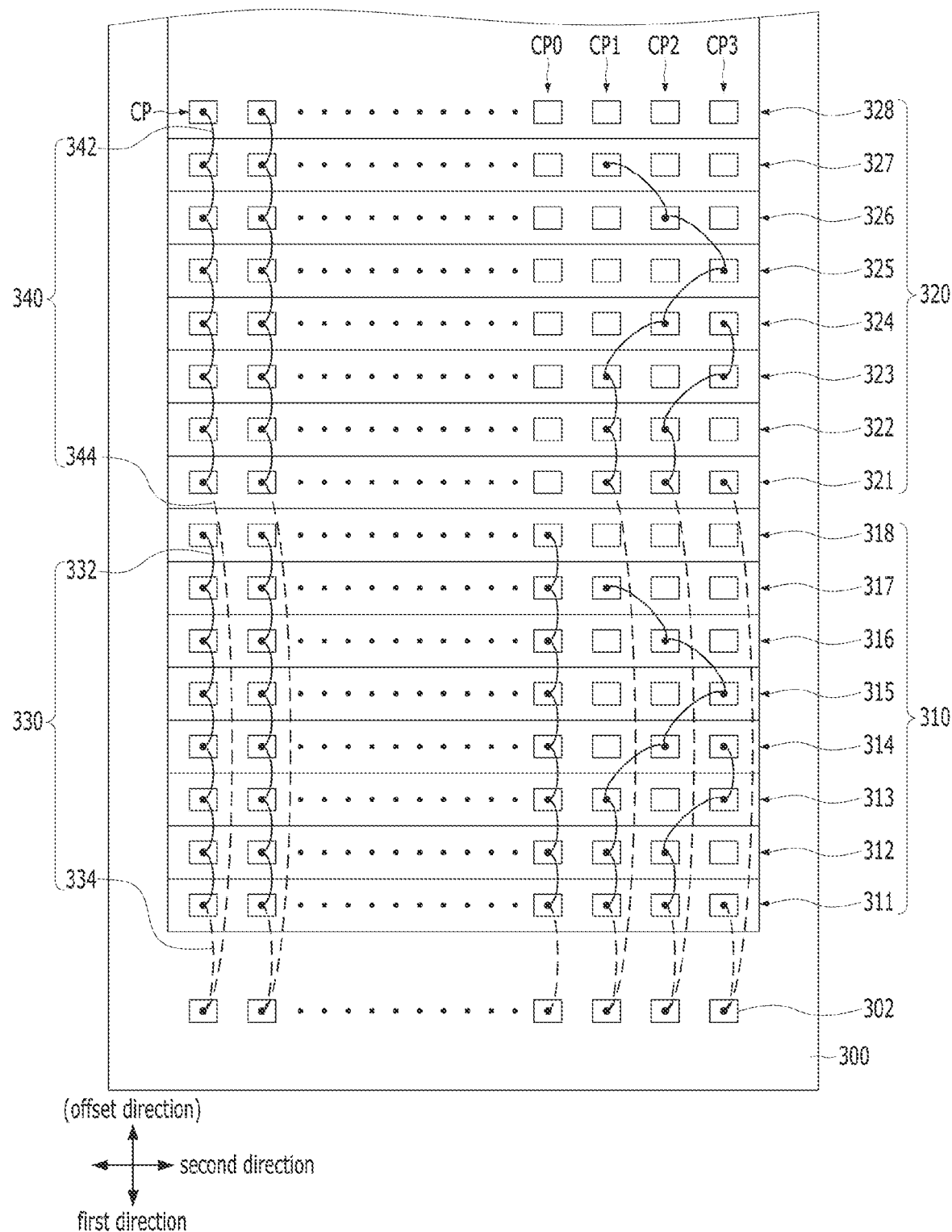
FIG. 3B is a plan view of a part of the semiconductor package of FIG. 3A viewed from above.

FIG. 3A is a cross-sectional view illustrating a semiconductor package of another embodiment of the present disclosure, and FIG. 3B is a plan view of a part of the semiconductor package of FIG. 3A viewed from above. FIG. 3C is a view illustrating power supply states of stack identification pads and chip identification pads of a plurality of semiconductor chips included in the semiconductor package of FIGS. 3A and 3B as logical values. The description will focus on differences from the above-described embodiments.

First, referring to FIGS. 3A and 3B, a semiconductor package of the present embodiment may include a base layer 300, a first chip stack 310 formed over one surface of the base layer 300 and including a plurality of semiconductor chips 311 to 318, a first wire 330 connecting the first chip stack 310 and the base layer 300 while connecting the plurality of semiconductor chips 311 to 318 to each other, a second chip stack 320 formed over the first chip stack 310 and including a plurality of semiconductor chips 321 to 328, a second wire 340 connecting the second chip stack 320 and the base layer 300 while connecting the plurality of semiconductor chips 321 to 328 to each other, an external connection terminal 350 formed over the other surface of the base layer 300, and a molding layer 360 covering the first and second chip stacks 310 and 320.

The first chip stack 310 may include eight semiconductor chips 311 to 318, that is, first to eighth semiconductor chips 311 to 318 which are stacked over the one surface of the base layer 300 in a vertical direction. The first to eighth semiconductor chips 311 to 318 may be attached to upper surfaces of the base layer 300 and the first to seventh semiconductor chips 311 to 317, respectively, by an adhesive layer AL formed over lower surfaces thereof.

A plurality of chip pads CP may be disposed on the upper surface of each of the first to eighth semiconductor chips 311 to 318. The plurality of chip pads CP may be disposed at one side edge region of each of the first to eighth semiconductor chips 311 to 318 in a first direction. The first to eighth semiconductor chips 311 to 318 may be offset stacked so that all the chip pads CP are exposed. One side surfaces and the other side surfaces of the first to eighth semiconductor chips 311 to 318 in a second direction crossing the first direction may be substantially aligned with each other.

In each of the first to eighth semiconductor chips 311 to 318, the plurality of chip pads CP may be arranged in a line along the second direction. Particularly, some of the plurality of chip pads CP may function as stack identification pads CP0 for distinguishing the first chip stack 310 from the second chip stack 320, and chip identification pads CP1, CP2, and CP3 for identifying the first to eighth semiconductor chips 311 to 318 included in the first chip stack 310. The arrangement of the stack identification pads CP0 and the chip identification pads CP1, CP2, and CP3 in the first chip stack 310, power application, and connection with the first wire 330 accordingly, will be described later.

The first wire 330 may provide the connection between the first to eighth semiconductor chips 311 to 318 included in the first chip stack 310 and between the first chip stack 310 and the base layer 300. For convenience of description, a part of the first wire 330, which connects the chip pads CP between the first to eighth semiconductor chips 311 to 318, will be referred to as a first inter-chip wire 332, and a part of the first wire 330, which connects the chip pad CP of the first semiconductor chip 311 located at the lowermost portion of the first chap stack 310 and the pad 302 of the base layer 300, will be referred to as a first stack wire 334.

The second chip stack 320 may include the plurality of semiconductor chips 321 to 328 which are stacked over the first chip stack 310 in the vertical direction. The first to eighth semiconductor chips 321 to 328 may be attached to upper surfaces of the eighth semiconductor chip 318 of the first chip stack 310 and the first to seventh semiconductor chips 321 to 327, respectively, by an adhesive layer AL formed over lower surfaces thereof.

The plurality of chip pads CP may be disposed on the upper surface of each of the first to eighth semiconductor chips 321 to 328. The plurality of chip pads CP may be disposed at one side edge region of each of the first to eighth semiconductor chips 321 to 328 in a first direction. The first to eighth semiconductor chips 321 to 328 may be offset stacked so that all the chip pads CP are exposed. One side surfaces and the other side surfaces of the first to eighth semiconductor chips 321 to 328 in the second direction may be substantially aligned with each other. Further, the one side surfaces and the other side surfaces of the first to eighth semiconductor chips 321 to 328 in the second direction, may be aligned with the one side surfaces and the other side surfaces of the first to eighth semiconductor chips 311 to 318.

In each of the first to eighth semiconductor chips 321 to 328, the plurality of chip pads CP may be arranged in a line along the second direction. Particularly, some of the plurality of chip pads CP may function as the stack identification pads CP0 for distinguishing the first chip stack 310 from the second chip stack 320, and the chip identification pads CP1, CP2, and CP3 for identifying the first to eighth semiconductor chips 321 to 328 included in the second chip stack 320. The arrangement of the stack identification pads CP0 and the chip identification pads CP1, CP2, and CP3 in the second chip stack 320, power application, and connection with the second wire 340 accordingly, will be described later.

The second wire 340 may provide the connection between the first to eighth semiconductor chips 321 to 328 included in the second chip stack 320 and between the second chip stack 320 and the base layer 300. For convenience of description, a part of the second wire 340, which connects the chip pads CP between the first to eighth semiconductor chips 321 to 328, will be referred to as a second inter-chip wire 342, and a part of the first wire 330, which connects the chip pad CP of the first semiconductor chip 321 located at the lowermost portion of the second chip stack 320 and the pad 302 of the base layer 300, will be referred to as a second stack wire 344.

In the above semiconductor package, because the first chip stack 310 includes $2^3$ semiconductor chips 311 to 318, each of the first to eighth semiconductor chips 311 to 318 may include at least three chip identification pads to distinguish/identify them within the first chip stack 310. For example, each of the first to eighth semiconductor chips 311 to 318 may include first to third chip identification pads CP1, CP2, and CP3. This is because $2^3$ states may be expressed by using three chip identification pads. Further, in order to distinguish/identify the first chip stack 310 and the second chip stack 320, each of the first to eighth semiconductor chips 311 to 318 of the first chip stack 310 may include one stack identification pad CP0. Also, because the second chip stack 320 includes $2^3$ semiconductor chips 321 to 328, each of the first to eighth semiconductor chips 321 to 328 may include at least three chip identification pads, that is, first to third chip identification pads CP1, CP2, and CP3, to distinguish/identify them within the second chip stack 320. Further, in order to distinguish/identify the first chip stack 310 and the second chip stack 320, each of the first to eighth semiconductor chips 321 to 328 of the second chip stack 320 may include one stack identification pad CP0.

In the first chip stack 310 and the second chip stack 320, the stack identification pads CP0 may be substantially aligned with each other along the first direction, the first chip identification pads CP1 may be substantially aligned with each other along the first direction, the second chip identification pads CP2 may be substantially aligned with each other along the first direction, and the third chip identification pads CP3 may be substantially aligned with each other along the first direction. Also, in the second direction, the stack identification pad CP0, the first chip identification pad CP1, the second chip identification pad CP2, and the third chip identification pad CP3 may be arranged adjacent to each other. However, the present disclosure is not limited thereto, and in another embodiment, the first to third chip identification pads CP1, CP2, and CP3 may be adjacent to each other, and the stack identification pad CP0 may be spaced apart from the first to third chip identification pads CP1, CP2, and CP3, in the second direction. That is, another chip pad CP may be disposed between the stack identification pad CP0 and the first to third chip identification pads CP1, CP2, and CP3. The first to eighth semiconductor chips 311 to 318 of the first chip stack 310 and the first to eighth semiconductor chips 321 to 328 of the second chip stack 320 may be distinguished from each other according to combinations of power applied to the stack identification pad CP0, the first chip identification pad CP1, the second chip identification pad CP2, and the third chip identification pad CP1. This will be described below with further reference to FIG. 3C together with FIG. 3B.

Referring to FIGS. 3B and 3C, the power supply states of the stack identification pads CP0 of the first chip stack 310 may be different from the power supply states of the stack identification pads CP0 of the second chip stack 320 so that the first chip stack 310 and the second chip stack 320 are distinguished/identified. That is, the logical value of the stack identification pads CP0 of the first chip stack 310 may be different from the logical value of the stack identification pads CP0 of the second chip stack 320. In the present embodiment, the stack identification pads CP0 of the first to eighth semiconductor chips 311 to 318 of the first chip stack 310 may be supplied with the power, that is, may have the logical value '1', and the stack identification pads CP0 of the first to eighth semiconductor chips 321 to 328 of the second chip stack 320 may be in the floating state, that is, may have the logical value '0'. Because the stack identification pads CP0 of the first to eighth semiconductor chips 321 to 328 of the second chip stack 320 do not receive the power, bonding wire connection may be omitted as illustrated.

The stack identification pads CP0 of the first chip stack 310 may be connected to the base layer 300 through the first wire 330. More specifically, the stack identification pads CP0 of the first to eighth semiconductor chips 311 to 318 of the first chip stack 310 may be connected to each other through the first inter-chip wire 332, and the stack identification pad CP0 of the first semiconductor chip 311 may be connected to the pad 302 of the base layer 300 through the first stack wire 334. Because the stack identification pads CP0 of the second chip stack 320 are in the floating state, they might not be connected to a wire.

In addition, in order to distinguish/identify the first to eighth semiconductor chips 311 to 318 in the first chip stack 310, eight logical value combinations expressed by the power supply states of the first to third chip identification pads CP1, CP2, and CP3 may be different from each other. In the present embodiment, the first to third chip identification pads CP1, CP2, and CP3 of the lowermost first semiconductor chip 311 may be in a state in which the power is applied. In each of the second to fourth semiconductor chips 312, 313, and 314, two selected among the first to third chip identification pads CP1, CP2, and CP3 may be applied with the power, and the other may be in the floating state. In particular, in order to form a short wire that does not skip a semiconductor chip in a diagonal direction and/or a straight direction, the power may be applied to the first to third chip identification pads CP1, CP2, and CP3 so that those in the floating state, among the first to third chip identification pads CP1, CP2, and CP3, are arranged in a diagonal direction. For example, the first and second chip identification pads CP1 and CP2 of the second semiconductor chip 312 may receive the power, the first and third chip identification pads CP1 and CP3 of the third semiconductor chip 313 may receive the power, and the second and third chip identification pads CP2 and CP3 of the fourth semiconductor chip 314 may receive the power. In this case, the third chip identification pad CP3 of the second semiconductor chip 312, the second chip identification pad CP2 of the third semiconductor chip 313, and the first chip identification pad CP1 of the fourth semiconductor chip 314 may be in the floating state, and may be arranged in a diagonal direction (see dotted line ①). In each of the fifth to seventh semiconductor chips 315, 316, and 317, one selected among the first to third chip identification pads CP1, CP2, and CP3 may be applied with the power. In particular, in order to form a short wire that does not skip a semiconductor chip in a diagonal direction and/or a straight direction, those to which the power is applied, among the first to third chip identification pads CP1, CP2, and CP3, may be arranged in a diagonal direction. For example, the third chip identification pad CP3 of the fifth semiconductor chip 315 may receive the power, the second chip identification pad CP2 of the sixth semiconductor chip 316 may receive the power, and the first chip identification pad CP1 of the seventh semiconductor chip 317 may receive the power (see dotted line ②). In the eighth semiconductor chip 318, the first to third chip identification pads CP1, CP2, and CP3 may be in the floating state.

The first to third chip identification pads CP1, CP2, and CP3 of the first chip stack 310 may be connected to the base layer 300 through the first wire 330. More specifically, the first chip identification pad CP1 of the seventh semiconductor chip 317, the second chip identification pad CP2 of the sixth semiconductor chip 316, the third chip identification pad CP3 of the fifth semiconductor chip 315, the second chip identification pad CP2 of the fourth semiconductor chip 314, the first chip identification pad CP1 of the third semiconductor chip 313, the first chip identification pad CP1 of the second semiconductor chip 312, and the first chip identification pad CP1 of the first semiconductor chip 311 may be connected to each other through the first inter-chip wire 332. In addition, the third chip identification pad CP3 of the fourth semiconductor chip 314, the third chip identification pad CP3 of the third semiconductor chip 313, the second chip identification pad CP2 of the second semiconductor chip 312, and the second chip identification pad CP2 of the first semiconductor chip 311 may be connected to each other through the first inter-chip wire 332. The first to third chip identification pads CP1, CP2, and CP3 of the first semiconductor chip 311 may be connected to the pad 302 of the base layer 300 through the first stack wire 334.

Similarly, in order to distinguish/identify the first to eighth semiconductor chips 321 to 328 in the second chip stack 320, eight logical value combinations expressed by the power supply states of the first to third chip identification pads CP1, CP2, and CP3 may be different from each other. In the present embodiment, the first to third chip identification pads CP1, CP2, and CP3 of the lowermost first semiconductor chip 321 may be in a state in which the power is applied. In each of the second to fourth semiconductor chips 322, 323, and 324, two selected among the first to third chip identification pads CP1, CP2, and CP3 may be applied with the power, and the other may be in the floating state. In particular, in order to form a short wire that does not skip a semiconductor chip in a diagonal direction and/or a straight direction, the power may be applied to the first to third chip identification pads CP1, CP2, and CP3 so that those in the floating state, among the first to third chip identification pads CP1, CP2, and CP3, are arranged in a diagonal direction. For example, the first and second chip identification pads CP1 and CP2 of the second semiconductor chip 322 may receive the power, the first and third chip identification pads CP1 and CP3 of the third semiconductor chip 323 may receive the power, and the second and third chip identification pads CP2 and CP3 of the fourth semiconductor chip 324 may receive the power. In this case, the third chip identification pad CP3 of the second semiconductor chip 322, the second chip identification pad CP2 of the third semiconductor chip 323, and the first chip identification pad CP1 of the fourth semiconductor chip 324 may be in the floating state, and may be arranged in a diagonal direction (see dotted line ③). In each of the fifth to seventh semiconductor chips 325, 326, and 327, one selected among the first to third chip identification pads CP1, CP2, and CP3 may be applied with the power. In particular, in order to form a short wire that does not skip a semiconductor chip in a diagonal direction and/or a straight direction, those to which the power is applied, among the first to third chip identification pads CP1, CP2, and CP3, may be arranged in a diagonal direction. For example, the third chip identification pad CP3 of the fifth semiconductor chip 325 may receive the power, the second chip identification pad CP2 of the sixth semiconductor chip 326 may receive the power, and the first chip identification pad CP1 of the seventh semiconductor chip 327 may receive the power (see dotted line ④). In the eighth semiconductor chip 328, the first to third chip identification pads CP1, CP2, and CP3 may be in the floating state.

The first to third chip identification pads CP1, CP2, and CP3 of the second chip stack 320 may be connected to the base layer 300 through the second wire 340. More specifically, the first chip identification pad CP1 of the seventh semiconductor chip 327, the second chip identification pad CP2 of the sixth semiconductor chip 326, the third chip identification pad CP3 of the fifth semiconductor chip 325, the second chip identification pad CP2 of the fourth semiconductor chip 324, the first chip identification pad CP1 of the third semiconductor chip 323, the first chip identification pad CP1 of the second semiconductor chip 322, and the first chip identification pad CP1 of the first semiconductor chip 321 may be connected to each other through the second inter-chip wire 342. In addition, the third chip identification pad CP3 of the fourth semiconductor chip 324, the third chip identification pad CP3 of the third semiconductor chip 323, the second chip identification pad CP2 of the second semiconductor chip 322, and the second chip identification pad CP2 of the first semiconductor chip 321 may be connected to each other through the second inter-chip wire 342. The first to third chip identification pads CP1, CP2, and CP3 of the first semiconductor chip 321 may be connected to the pad 302 of the base layer 300 through the second stack wire 344.

Meanwhile, the power supply states of the first to third chip identification pads CP1, CP2, and CP3 of the first chip stack 310 and the connection form of the first wire 330 accordingly, and the power supply states of the first to third chip identification pads CP1, CP2, and CP3 of the second chip stack 320 and the connection form of the second wire 340 accordingly, are not limited to the illustrated ones. When the power is applied to all of the first to third chip identification pads CP1, CP2, and CP3 of the first semiconductor chips 311 and 321 respectively positioned at the lowermost portions of the first and second chip stacks 310 and 320, the power is applied to two selected from the first to third chip identification pads CP1, CP2, and CP3 of each of the second to fourth semiconductor chips 312 to 314, and 322 to 324, the power is applied to one selected from the first to third chip identification pads CP1, CP2, and CP3 of each of the fifth to seventh semiconductor chips 315 to 317, and 325 to 327, and all of the first to third chip identification pads CP1, CP2, and CP3 of the eighth semiconductor chips 318 and 328 respectively positioned at the uppermost portions of the first and second chip stacks 310 and 320 are in the floating state, the power supply states of the first to third chip identification pads CP1, CP2, and CP3 of the second to seventh semiconductor chips 312 to 317, and 322 to 327, and connection forms of the first and second inter-chip wires 332 and 342 accordingly, may be variously modified. Here, in the first chip stack 310, the selected two of the second semiconductor chip 312, the selected two of the third semiconductor chip 313, and the selected two of the fourth semiconductor chip 314 may be different from each other, and in the second chip stack 320, the selected two of the second semiconductor chip 322, the selected two of the third semiconductor chip 323, and the selected two of the fourth semiconductor chip 324 may be different from each other. Also, in the first chip stack, 310, the selected one of the fifth semiconductor chip 315, the selected one of the sixth semiconductor chip 316, and the selected one of the seventh semiconductor chip 317 may be different from each other, and in the second chip stack 320, the selected one of the fifth semiconductor chip 325, the selected one of the sixth semiconductor chip 326, and the selected one of the seventh semiconductor chip 327 may be different from each other. This will be described, for example, with reference to FIGS. 3D to 3F.

FIGS. 3D to 3F are views illustrating power supply states of stack identification pads and chip identification pads of a plurality of semiconductor chips included in a semiconductor package according to another embodiment of the present disclosure as logical values. In these figures, the wire connected to the stack identification pads and the chip identification pads are shown in the form of arrows. The description will focus on differences from the semiconductor package of FIGS. 3A to 3C described above.

Referring to FIG. 3D, the second and third chip identification pads CP2 and CP3 of the second semiconductor chips 312 and 322 may be applied with the power, the first and third chip identification pads CP1 and CP3 of the third semiconductor chips 313 and 323 may be applied with the power, and the first and second chip identification pads CP1 and CP2 of the fourth semiconductor chips 314 and 324 may be applied with the power. In this case, the first chip identification pad CP1 of the second semiconductor chips 312 and 322, the second chip identification pad CP2 of the third semiconductor chips 313 and 323, and the third chip identification pad CP3 of the fourth semiconductor chips 314 and 324, which are in the floating state, may be arranged in a diagonal direction (see dotted lines ① and ③). However, this diagonal direction may be opposite to that shown in FIG. 3C.

The third chip identification pad CP3 of the fifth semiconductor chips 315 and 325 may be applied with the power, the second chip identification pad CP2 of the sixth semiconductor chips 316 and 326 may be applied with the power, the first chip identification pad CP1 of the seventh semiconductor chips 317 and 327 may be applied with the power, and they may be arranged in a diagonal direction (see dotted lines ② and ④). This diagonal direction may be the same as that shown in FIG. 3C.

In this case, the first chip identification pad CP1 of the seventh semiconductor chips 317 and 327, the second chip identification pad CP2 of the sixth semiconductor chips 316 and 326, the third chip identification pad CP3 of the fifth semiconductor chips 315 and 325, the second chip identification pad CP2 of the fourth semiconductor chips 314 and 324, the third chip identification pad CP3 of the third semiconductor chips 313 and 323, the third chip identification pad CP3 of the second semiconductor chips 312 and 322, and the third chip identification pad CP3 of the first semiconductor chips 311 and 321 may be connected to each other by an inter-chip wire. In addition, the first chip identification pad CP1 of the fourth semiconductor chips 314 and 324, the first chip identification pad CP1 of the third semiconductor chips 313 and 323, the second chip identification pad CP2 of the second semiconductor chips 312 and 322, and the second chip identification pad CP2 of the first semiconductor chips 311 and 321 may be connected to each other by another inter-chip wire. Each of the first to third clip identification pads CP1, CP2, and CP3 of the first semiconductor chips 311 and 321 may be connected to a base layer through a stack wire.

Referring to FIG. 3E, the second and third chip identification pads CP2 and CP3 of the second semiconductor chips 312 and 322 may be applied with the power, the first and third chip identification pads CP1 and CP3 of the third semiconductor chips 313 and 323 may be applied with the power, and the first and second chip identification pads CP1 and CP2 of the fourth semiconductor chips 314 and 324 may be applied with the power. In this case, the first chip identification pad CP1 of the second semiconductor chips 312 and 322, the second chip identification pad CP2 of the third semiconductor chips 313 and 323, and the third chip identification pad CP3 of the fourth semiconductor chips 314 and 324, which are in the floating state, may be arranged in a diagonal direction (see dotted lines ① and ③). However, this diagonal direction may be opposite to that shown in FIG. 3C.

The first chip identification pad CP1 of the semiconductor chips 315 and 325 may be applied with the power, the second chip identification pad CP2 of the sixth semiconductor chips 316 and 326 may be applied with the power, the third chip identification pad CP3 of the seventh semiconductor chips 317 and 327 may be applied with the power, and they may be arranged in a diagonal direction (see dotted lines ② and ④). This diagonal direction may be opposite to that shown in FIG. 3C.

In this case, the third chip identification pad CP3 of the seventh semiconductor chips 317 and 327, the second chip identification pad CP2 of the sixth semiconductor chips 316 and 326, the first chip identification pad CP1 of the fifth semiconductor chips 315 and 325, the second chip identification pad CP2 of the fourth semiconductor chips 314 and 324, the third chip identification pad CP3 of the third semiconductor chips 313 and 323, the third chip identification pad CP3 of the second semiconductor chips 312 and 322, and the third chip identification pad CP3 of the first semiconductor chips 311 and 321 may be connected to each other by an inter-chip wire. In addition, the first chip identification pad CP1 of the fourth semiconductor chips 314 and 324, the first chip identification pad CP1 of the third semiconductor chips 313 and 323, the second chip identification pad CP2 of the second semiconductor chips 312 and 322, and the second chip identification pad CP2 of the first semiconductor chips 311 and 321 may be connected to each other by another inter-chip wire. Each of the first to third chip identification pads CP1, CP2, and CP3 of the first semiconductor chips 311 and 321 may be connected to a base layer through a stack wire.

Referring to FIG. 3F, the first and second chip identification pads CP1 and CP2 of the second semiconductor chips 312 and 322 may be applied with the power, the first and third chip identification pads CP1 and CP3 of the third semiconductor chips 313 and 323 may be applied with the power, and the second and third chip identification pads CP2 and CP3 of the fourth semiconductor chips 314 and 324 may be applied with the power. In this case, the third chip identification pad CP3 of the second semiconductor chips 312 and 322, the second chip identification pad CP2 of the third semiconductor chips 313 and 323, and the first chip identification pad CP1 of the fourth semiconductor chips 314 and 324, which are in the floating state, may be arranged in a diagonal direction (see dotted lines ① and ③). This diagonal direction may be the same as that shown in FIG. 3C.

The first chip identification pad CP1 of the fifth semiconductor chips 315 and 325 may be applied with the power, the second chip identification pad CP2 of the sixth semiconductor chips 316 and 326 may be applied with the power, the third chip identification pad CP3 of the seventh semiconductor chips 317 and 327 may be applied with the power, and they may be arranged in a diagonal direction (see dotted lines ② and ④). This diagonal direction may be opposite to that shown in FIG. 3C.

In this case, the third chip identification pad CP3 of the seventh semiconductor chips 317 and 327, the second chip identification pad CP2 of the sixth semiconductor chips 316 and 326, the first chip identification pad CP1 of the fifth semiconductor chips 315 and 325, the second chip identification pad CP2 of the fourth semiconductor chips 314 and 324, the first chip identification pad CP1 of the third semiconductor chips 313 and 323, the first chip identification pad CP1 of the second semiconductor chips 312 and 322, and the first chip identification pad CP1 of the first semiconductor chips 311 and 321 may be connected to each other by an inter-chip wire. In addition, the third chip identification pad CP3 of the fourth semiconductor chips 314 and 324, the third chip identification pad CP3 of the third semiconductor chips 313 and 323, the second chip identification pad CP2 of the second semiconductor chips 312 and 322, and the second chip identification pad CP2 of the first semiconductor chips 311 and 321 may be connected to each other by another inter-chip wire. Each of the first to third chip identification pads CP1, CP2, and CP3 of the first semiconductor chips 311 and 321 may be connected to a base layer through a stack wire.

Although not shown, other embodiments may be possible. For example, the power supply states of the first to third chip identification pads CP1, CP2, and CP3 of the first chip stack 310, and the wire connection state may be the same as one of the embodiment of FIGS. 3B and 3C, the embodiment of FIG. 3D, the embodiment of FIG. 3E, and the embodiment of FIG. 3F. Also, the power supply states of the first to third chip identification pads CP1, CP2, and CP3 of the second chip stack 320, and the wire connection state may be the same as one of the embodiment of FIGS. 3B and 3C, the embodiment of FIG. 3D, the embodiment of FIG. 3E, and the embodiment of FIG. 3F. The power supply states of the first to third chip identification pads CP1, CP2, and CP3 of the first chip stack 310, and the wire connection state may be different from the power supply states of the first to third chip identification pads CP1, CP2, and CP3 of the second chip stack 320, and the wire connection state.

In the above embodiments, when the semiconductor package includes two chip stacks and each chip stack includes 4 or 8 semiconductor chips, the arrangement of the stack identification pads and the chip identification pads, the power application, and the wire connection has been described. However, the present disclosure is not limited thereto, and this concept is expanded and described as follows.

A semiconductor package according to the present embodiment may include a base layer and first and second chip stacks formed over the base layer.

Each of the first and second chip stacks may include a plurality of semiconductor chips. Chip pads may be disposed at one side edge region of each of the semiconductor chips in a first direction, and may be arranged in a line in a second direction. The plurality of semiconductor chips may be offset stacked in a direction away from the one side in the first direction so that the chip pads are exposed. Further, in the first direction, the one side of the lowermost semiconductor chip of the second chip stack may protrude toward a direction opposite to the offset direction than the one side of the uppermost semiconductor chip of the first chip stack.

The chip pads may include stack identification pads to identify the first chip stack and the second chip stack, and chip identification pads to identify semiconductor chips included in each of the first and second chip stacks. Each semiconductor chip may include one stack identification pad. The stack identification pads may be substantially aligned in a line along the first direction. When each of the first and second chip stacks includes $2^{N-1}$ semiconductor chips, each semiconductor chip may include N−1 chip identification pads. When N−1 chip identification pads are sequentially referred to as first to N−1th chip identification pads from any one side of each semiconductor chip in the second direction, nth chip identification pads of the semiconductor chips may be substantially aligned in a line along the first direction, where n is a natural number of 1 or more and N−1 or less. The $2^{N-1}$ semiconductor chips included in each of the first and second chip stacks may be referred to as first to Kth semiconductor chips according to a distance from the base layer, where K is the same as $2^{N-1}$.

The stack identification pads of the semiconductor chips included in one of the first and second chip stacks, for example, the stack identification pads of the first chip stack may be in a state in which power is applied, and the stack identification pads of the semiconductor chips included in the other of the first and second chip stacks, for example, the stack identification pads of the second chip stack may be in a floating state. The stack identification pads of the first to Kth semiconductor chips of the first chip stack may be connected to each other through an inter-chip wire, and the stack identification pad of the first semiconductor chip of the first chip stack may be connected to the base layer through a stack wire.

In each of the first and second chip stacks, each of the first to Kth semiconductor chips may be distinguished by combinations of power supply states and floating states of its N−1 chip identification pads. That is, the combinations of the power supply states and the floating states of the chip identification pads of the first to Kth semiconductor chips may be different from each other.

All of the chip identification pads of the first semiconductor chip may be in a state in which the power is applied, and all of the chip identification pads of the Kth semiconductor chip may be in the floating state. Some of the chip identification pads of the second to K−1th semiconductor chips may be supplied with the power and the rest may be in the floating state. In each of the first and second chip stacks, the chip identification pad of the first semiconductor chip may be connected to the base layer through the stack wire. In addition, in each of the first and second chip stacks, chip identification pads to which the power is applied between the first to K−1th semiconductor chips may be connected to each other by the inter-chip wire.

Here, the chip identification pads to which the power is applied in the second to K−1th semiconductor chips positioned between the first semiconductor chip and the Kth semiconductor chip, may be arranged so that a long inter-chip wire skipping a semiconductor chip does not occur. To this end, in the second to K−1th semiconductor chips, the chip identification pads in a state in which the power is applied and/or in the floating state may be arranged in a diagonal direction crossing the first and second directions. In this case, the inter-chip wire connected to the nth chip identification pad of the kth semiconductor chip among the first to K−1 semiconductor chips may be connected to one of the n−1th chip identification pad, the nth chip identification pad, and the n+1th chip identification pad of the k−1th and/or k+1th semiconductor chip adjacent to the kth semiconductor chip, where k is a natural number of 1 or more and K−1 or less. That is, the inter-chip wire may be formed as a short wire that does not skip the semiconductor chip by connecting chip identification pads of adjacent semiconductor chips to each other in the diagonal direction or the first direction.

Further, the second to K−1th semiconductor chips may be grouped into one or more groups, and the number of chip identification pads to which the power is applied in each semiconductor chip belonging to a specific group may decrease sequentially, according to the distance between the specific group and the first semiconductor chip. The grouping method examples have been described in the above embodiments. For example, when each of the first and second chip stacks includes first to fourth semiconductor chips, there may be one group including the second and third semiconductor chips, and each of the second and third semiconductor chips of this group may have one chip identification pad to which the power is applied. Here, it has been described that the chip identification pads to which the power is applied may be arranged in the diagonal direction. Alternatively, for example, when each of the first and second chip stacks includes the first to eighth semiconductor chips, a first group including the second to fourth semiconductor chips and a second group including the fifth to seventh semiconductor chips may exist, and each of the second to fourth semiconductor chips of the first group may have two chip identification pads to which the power is applied, and each of the fifth to seventh semiconductor chips of the second group may have one chip identification pad to which the power is applied. Here, it has been described that the chip identification pads in the floating state of the second to fourth semiconductor chips may be arranged in the diagonal direction, and the chip identification pads to which the power is applied of the fifth to seventh semiconductor chips may be arranged in the diagonal direction.

According to the above embodiments of the present disclosure, it may be possible to provide a semiconductor package capable of reducing a failure and improving operation characteristics while satisfying the demand for high performance/high capacity.

Figure 4:
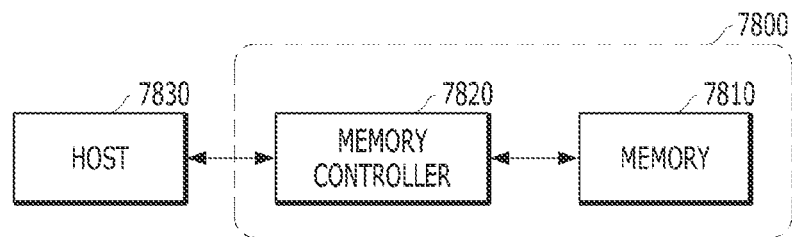
FIG. 4 shows a block diagram illustrating an electronic system employing a memory card including a semiconductor package, according to an embodiment.

FIG. 4 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 5:
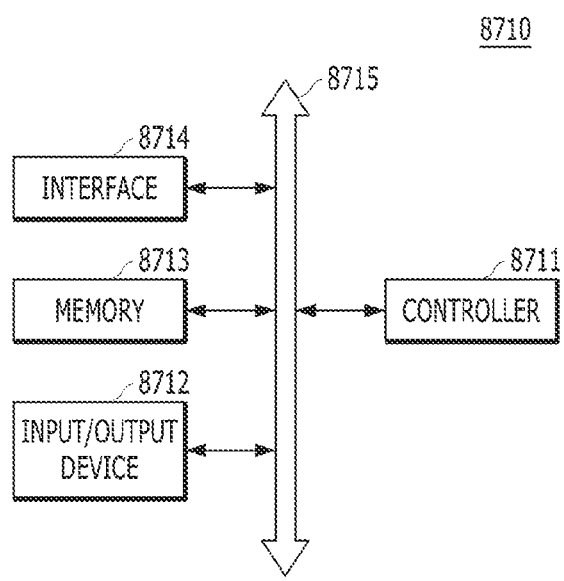
FIG. 5 shows a block diagram illustrating another electronic system including a semiconductor package, according to an embodiment.

FIG. 5 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor package comprising:
   a base layer; and
   a first chip stack and a second chip stack sequentially stacked over the base layer,
   wherein each of the first and second chip stacks include first to fourth semiconductor chips which are offset stacked to expose chip pads at one side edge of each of the first to fourth semiconductor chips,
   wherein the chip pads include:
   stack identification pads for identifying the first chip stack and the second chip stack, and
   first and second chip identification pads for identifying the first to fourth semiconductor chips in each of the first and second chip stacks,
   wherein:
   power is applied to the stack identification pads of the first to fourth semiconductor chips of one of the first and second chip stacks,
   in the first chip stack,
   the power is applied to:
   the first and second chip identification pads of the first semiconductor chip,
   one of the first and second chip identification pads of the second semiconductor chip, and
   the other of the first and second chip identification pads of the third semiconductor chip, and
   in the second chip stack,
   the power is applied to:
   the first and second chip identification pads of the first semiconductor chip,
   one of the first and second chip identification pads of the second semiconductor chip, and
   the other of the first and second chip identification pads of the third semiconductor chip.

2. The semiconductor package according to claim 1, further comprising:
   an inter-chip wire connecting the stack identification pads to which the power is applied to each other; and
   a stack wire connecting the stack identification pad to which the power is applied of the first semiconductor chip to the base layer.

3. The semiconductor package according to claim 1, wherein the power is applied to the stack identification pads of the first to fourth semiconductor chips of the first chip stack.

4. The semiconductor package according to claim 1, wherein, in at least one of the first chip stack and the second chip stack, the power is applied to the first chip identification pad of the second semiconductor chip and the second chip identification pad of the third semiconductor chip,
   the semiconductor package further comprising:
   an inter-chip wire connecting the second chip identification pad of the third semiconductor chip, the first chip identification pad of the second semiconductor chip, and the first chip identification pad of the first semiconductor chip; and
   a stack wire connecting the first and second chip identification pads of the first semiconductor chip to the base layer.

5. The semiconductor package according to claim 1, wherein, in at least one of the first chip stack and the second chip stack, the power is applied to the second chip identification pad of the second semiconductor chip and the first chip identification pad of the third semiconductor chip,
   the semiconductor package further comprising:
   an inter-chip wire connecting the first chip identification pad of the third semiconductor chip, the second chip identification pad of the second semiconductor chip, and the second chip identification pad of the first semiconductor chip; and
   a stack wire connecting the first and second chip identification pads of the first semiconductor chip to the base layer.

6. The semiconductor package according to claim 1, wherein, remaining ones of the stack identification pads and the first and second chip identification pads, that are not power-applied ones of the stack identification pads and the first and second chip identification pads, are in a floating state.

7. The semiconductor package according to claim 6, wherein the stack identification pads, and the first and second chip identification pads, which are in the floating state, are not connected to a wire.

8. The semiconductor package according to claim 1, wherein the stack identification pads are aligned with each other along an offset direction,
   the first chip identification pads are aligned with each other along the offset direction, and
   the second chip identification pads are aligned with each other along the offset direction.

9. The semiconductor package according to claim 1, wherein one side surface of the first semiconductor chip located at a lowermost portion of the second chip stack protrudes in a direction opposite to the offset direction farther than one side surface of the fourth semiconductor chip located at an uppermost portion of the first chip stack.

10. A semiconductor package comprising:
a base layer; and
a first chip stack and a second chip stack sequentially stacked over the base layer,
wherein each of the first and second chip stacks include first to eighth semiconductor chips which are offset stacked to expose chip pads at one side edge of each of the first to eighth semiconductor chips,
wherein the chip pads include:
stack identification pads for identifying the first chip stack and the second chip stack, and
first to third chip identification pads for identifying the first to eighth semiconductor chips in each of the first and second chip stacks,
wherein:
power is applied to the stack identification pads of the first to eighth semiconductor chips of one of the first and second chip stacks,
in the first chip stack,
the power is applied to:
the first to third chip identification pads of the first semiconductor chip,
two selected from the first to third chip identification pads of each of the second to fourth semiconductor chips, and
one selected from the first to third chip identification pads of each of the fifth to seventh semiconductor chips,
where the selected two of the second semiconductor chip, the selected two of the third semiconductor chip, and the selected two of the fourth semiconductor chip are different from each other, and
the selected one of the fifth semiconductor chip, the selected one of the sixth semiconductor chip, and the selected one of the seventh semiconductor chip are different from each other, and
in the second chip stack,
the power is applied to:
the first to third chip identification pads of the first semiconductor chip,
two selected from the first to third chip identification pads of each of the second to fourth semiconductor chips, and
one selected from the first to third chip identification pads of each of the fifth to seventh semiconductor chips,
where the selected two of the second semiconductor chip, the selected two of the third semiconductor chip, and the selected two of the fourth semiconductor chip are different from each other, and
the selected one of the fifth semiconductor chip, the selected one of the sixth semiconductor chip, and the selected one of the seventh semiconductor chip are different from each other.

11. The semiconductor package according to claim 10, further comprising:
an inter-chip wire connecting the stack identification pads to which the power is applied to each other; and
a stack wire connecting the stack identification pad to which the power is applied of the first semiconductor chip to the base layer.

12. The semiconductor package according to claim 10, wherein the power is applied to the stack identification pads of the first to eighth semiconductor chips of the first chip stack.

13. The semiconductor package according to claim 10, wherein, the power is applied to the first and second chip identification pads of the second semiconductor chip, the first and third chip identification pads of the third semiconductor chip, the second and third chip identification pads of the fourth semiconductor chip, the third chip identification pad of the fifth semiconductor chip, the second chip identification pad of the sixth semiconductor chip, and the first chip identification pad of the seventh semiconductor chip in at least one of the first chip stack and the second chip stack,
the semiconductor package further comprising:
an inter-chip wire connecting the first chip identification pad of the seventh semiconductor chip, the second chip identification pad of the sixth semiconductor chip, the third chip identification pad of the fifth semiconductor chip, the second chip identification pad of the fourth semiconductor chip, the first chip identification pad of the third semiconductor chip, the first chip identification pad of the second semiconductor chip, and the first chip identification pad of the first semiconductor chip, and connecting the third chip identification pad of the fourth semiconductor chip, the third chip identification pad of the third semiconductor chip, the second chip identification pad of the second semiconductor chip, and the second chip identification pad of the first semiconductor chip; and
a stack wire connecting the first to third chip identification pads of the first semiconductor chip to the base layer.

14. The semiconductor package according to claim 10, wherein, the power is applied to the second and third chip identification pads of the second semiconductor chip, the first and third chip identification pads of the third semiconductor chip, the first and second chip identification pads of the fourth semiconductor chip, the third chip identification pad of the fifth semiconductor chip, the second chip identification pad of the sixth semiconductor chip, and the first chip identification pad of the seventh semiconductor chip in at least one of the first chip stack and the second chip stack,
the semiconductor package further comprising:
an inter-chip wire connecting the first chip identification pad of the seventh semiconductor chip, the second chip identification pad of the sixth semiconductor chip, the third chip identification pad of the fifth semiconductor chip, the second chip identification pad of the fourth semiconductor chip, the third chip identification pad of the third semiconductor chip, the third chip identification pad of the second semiconductor chip, and the third chip identification pad of the first semiconductor chip, and connecting the first chip identification pad of the fourth semiconductor chip, the first chip identification pad of the third semiconductor chip, the second chip identification pad of the second semiconductor chip, and the second chip identification pad of the first semiconductor chip; and
a stack wire connecting the first to third chip identification pads of the first semiconductor chip to the base layer.

15. The semiconductor package according to claim 10, wherein, the power is applied to the second and third chip identification pads of the second semiconductor chip, the first and third chip identification pads of the third semiconductor chip, the first and second chip identification pads of the fourth semiconductor chip, the first chip identification pad of the fifth semiconductor chip, the second chip identification pad of the sixth semiconductor chip, and the third chip identification pad of the seventh semiconductor chip in at least one of the first chip stack and the second chip stack, the semiconductor package further comprising:
an inter-chip wire connecting the third chip identification pad of the seventh semiconductor chip, the second chip identification pad of the sixth semiconductor chip, the first chip identification pad of the fifth semiconductor chip, the second chip identification pad of the fourth semiconductor chip, the third chip identification pad of the third semiconductor chip, the third chip identification pad of the second semiconductor chip, and the third chip identification pad of the first semiconductor chip, and connecting the first chip identification pad of the fourth semiconductor chip, the first chip identification pad of the third semiconductor chip, the second chip identification pad of the second semiconductor chip, and the second chip identification pad of the first semiconductor chip; and
a stack wire connecting the first to third chip identification pads of the first semiconductor chip to the base layer.

16. The semiconductor package according to claim 10, wherein, the power is applied to the first and second chip identification pads of the second semiconductor chip, the first and third chip identification pads of the third semiconductor chip, the second and third chip identification pads of the fourth semiconductor chip, the first chip identification pad of the fifth semiconductor chip, the second chip identification pad of the sixth semiconductor chip, and the third chip identification pad of the seventh semiconductor chip in at least one of the first chip stack and the second chip stack,
the semiconductor package further comprising:
an inter-chip wire connecting the third chip identification pad of the seventh semiconductor chip, the second chip identification pad of the sixth semiconductor chip, the first chip identification pad of the fifth semiconductor chip, the second chip identification pad of the fourth semiconductor chip, the first chip identification pad of the third semiconductor chip, the first chip identification pad of the second semiconductor chip, and the first chip identification pad of the first semiconductor chip, and connects the third chip identification pad of the fourth semiconductor chip, the third chip identification pad of the third semiconductor chip, the second chip identification pad of the second semiconductor chip, and the second chip identification pad of the first semiconductor chip; and
a stack wire connecting the first to third chip identification pads of the first semiconductor chip to the base layer.

17. The semiconductor package according to claim 10, wherein, remaining ones of the stack identification pads and the first to third chip identification pads, that are not power-applied ones of the stack identification pads and the first to third chip identification pads, are in a floating state.

18. The semiconductor package according to claim 17, wherein the stack identification pads, and the first to third chip identification pads, which are in the floating state, are not connected to a wire.

19. The semiconductor package according to claim 10, wherein the stack identification pads are aligned with each other along an offset direction,
the first chip identification pads are aligned with each other along the offset direction,
the second chip identification pads are aligned with each other along the offset direction, and
the third chip identification pads are aligned with each other along the offset direction.

20. The semiconductor package according to claim 10, wherein one side surface adjacent to the chip pads of the first semiconductor chip of the second chip stack protrudes toward a direction opposite to an offset direction than one side surface adjacent to the chip pads of the eighth semiconductor chip of the first chip stack.

* * * * *